United States Patent [19]

Lee et al.

[11] Patent Number: 5,660,895

[45] Date of Patent: Aug. 26, 1997

[54] LOW-TEMPERATURE PLASMA-ENHANCED CHEMICAL VAPOR DEPOSITION OF SILICON OXIDE FILMS AND FLUORINATED SILICON OXIDE FILMS USING DISILANE AS A SILICON PRECURSOR

[75] Inventors: Gil S. Lee; Joho Song, both of Baton Rouge, La.

[73] Assignee: Board of Supervisors of Louisiana State University and Agricultural and Mechanical College, Baton Rouge, La.

[21] Appl. No.: 636,929

[22] Filed: Apr. 24, 1996

[51] Int. Cl.$^6$ ............................ B05D 3/06; C23C 16/40
[52] U.S. Cl. .................. 427/579; 427/574; 427/575; 427/571
[58] Field of Search .................. 427/579, 574, 427/571, 575

[56] References Cited

FOREIGN PATENT DOCUMENTS 7-50296   2/1995   Japan .
7-050296  2/1995   Japan .

OTHER PUBLICATIONS

O. Joubert et al., "Influence of Ion Energy on the Physical Properties of Plasma Deposited $SiO_2$ Films," *Appl. Phys. Lett.*, vol. 62, pp. 228–230 (1993).

T. Herak et al., "Low–Temperature Deposition of Silicon Dioxide Films from Electron Cyclotron Resonant Microwave Plasmas," *J. Appl. Phys.*, vol. 65, pp. 2457–2463 (1989).

G. Kaganowicz et al., "Room Temperature Glow Discharge Deposition of Silicon Oxides from $SiH_4$ and $N_2O$," *J. Vac. Sci. Technol. A*, vol. 2, pp. 1233–1237 (1984).

Bozso et al., "Thermal and Electron–Beam–Induced Reaction of Disilane on Si(100)–(2×1)," *Phys. Rev. B.*, vol. 38, pp. 3943–3947 (1988).

G. Perkins et al., "The 147–nm Photolysis of Disilane," *J. Am. Chem. Soc.*, vol. 102, pp. 3764–3769 (1980).

Y. Ohshita, "Reaction of $Si_2H_6$ Molecule on a Silicon Surface," *J. Crystal Growth*, vol. 115, pp. 551–555 (1991).

Y. Nara, "Synchrotron Radiation–Assisted Silicon Homoepitaxy at 100° C Using $Si_2H_6/H_2$ Mixture," *Appl. Phys. Lett.*, vol. 61, pp. 93–95 (1992).

H. Hirayama et al., "Gas Source Silicon Molecular Beam Epitaxy Using Disilane," *Appl. Phys. Lett.*, vol. 52, pp. 1484–1486 (1988).

M. Tsuji et al., "Deposition of $SiO_2$ Films from ArF Laser Photolysis of $SiH_4/N_2O$ Mixtures," *Jpn. J. Appl. Phys.*, vol. 30, pp. 2868–2872 (1991).

P. Pai et al., "Infrared Spectroscopic Study of $SiO_x$ Films Produced by Plasma Enhanced Chemical Vapor Deposition," *J. Vac. Sci. Technol. A*, vol. 4, pp. 689–694 (1986).

J. Batey et al., "Low–temperature Deposition of High–Quality Silicon Dioxide by Plasma–Enhanced Chemical Vapor Deposition," *J. Appl. Phys.*, vol. 60, pp. 3136–3145 (1986).

M. Ceiler et al., "Plasma–Enhanced Chemical Vapor Deposition of Silicon Dioxide Deposited at Low Temperatures," *J. Electrochem. Soc.*, vol. 142, pp. 2067–2071 (1995).

M. Liehr et al., "Low Pressure Chemical Vapor Deposition of Oxide from $SiH_4/O_2$: Chemistry and Effects on Electrical Properties," *Appl. Phys. Lett.*, vol. 60, pp. 198–200 (1992).

R. Chanana et al., "Effect of Annealing and Plasma Precleaning on the Electrical Properties of $N_2O/SiH_4$ PECVD Oxide as Gate Material in MOSFETs and CCDs," *Solid State Electronics*, vol. 36, pp. 1021–1026 (1993).

G. Lucovsky et al., "Deposition of Silicon Dioxide and Silicon Nitride by Remote Plasma Enhanced Chemical Vapor Deposition," *J. Vac. Sci. Technol. A*, vol. 4, pp. 681–688 (1986).

Y. Matsui et al., "Low–temperature Growth of $SiO_2$ Thin Film by Photo–Induced Chemical Vapor Deposition Using Synchrotron Radiation," *Jpn. J. Appl. Phys.*, vol. 31, pp. 1972–1978 (1992).

K. Inoue et al., "Low Temperature Growth of $SiO_2$ Thin Film by Double–Excitation Photo–CVD," *Jpn. J. Appl. Phys.*, vol. 26, pp. 805–811 (1987).

K. Inoue et al., "Growth of $SiO_2$ Thin Film by Selective Excitation Photo–CVD Using 123.6 nm VUV Light," *Jpn. J. Appl. Phys.*, vol. 27, pp. L2152–L2154 (1988).

M. Tsuji et al., "Deposition of $SiO_2$ Films from ArF Laser Photolysis of $Si_2H_6/N_2O$ Mixtures in a Parallel Irradiation Configuration," *Jpn. J. Appl. Phys.*, vol. 32, pp. 139–143 (1993).

R. Laxman, "Low $\epsilon$ Dielectrics: CVD Fluorinated Silicon Dioxides," *Semiconductor International*, pp. 71–74 (May 1995).

T. Usami et al., "Low Dielectric Constant Interlayer Using Fluorine–Doped Silicon Oxide," *Jpn. J. Appl. Phys.*, vol. 33, pp. 408–412 (1994).

(List continued on next page.)

*Primary Examiner*—Roy V. King
*Attorney, Agent, or Firm*—John H. Runnels

[57] ABSTRACT

High-quality $SiO_2$ films may be deposited at low temperatures by plasma-enhanced chemical vapor deposition using disilane ($Si_2H_6$) and nitrous oxide ($N_2O$) as silicon and oxygen precursors in an otherwise conventional reactor such as a parallel plate plasma reactor. The properties of the $SiO_2$ films deposited at 120° C. using $Si_2H_6$ and $N_2O$ were not significantly different from those of conventional $SiH_4$-based $SiO_2$ films deposited at the significantly higher temperature range 250°–350° C. PECVD deposition of $SiO_2$ films using $Si_2H_6$ and $N_2O$ provides a practical low temperature process for fabricating microdevices and circuits. This low temperature process can be used for deposition in the presence of polymers, semiconductors, and other components that would melt, decompose, or otherwise be sensitive to higher temperatures. Fluorinated silicon oxide may also be deposited at the relatively low temperature of 120° C. with plasma-enhanced chemical vapor deposition using $CF_4$ as a fluorine source in the deposition process from $Si_2H_6$ and $N_2O$. The incorporation of fluorine maintains the physical properties of the films, while improving their electrical properties, such as reducing failures due to early dielectric breakdowns, enhancing performance as an insulator, and reducing the presence of unwanted electrical charges.

10 Claims, 20 Drawing Sheets

OTHER PUBLICATIONS

T. Homma et al., "A Room Temperature Chemical Vapor Deposition SiOF Film Formation Technology for the Interlayer in Submicron Multilevel Interconnections," *J. Electrochem. Soc.*, vol. 140, pp. 687–692 (1993).

M. Shapiro et al., "CVD of Fluorosilicate Glass for ULSI Applications," *Thin Solid Films*, vol. 270, pp. 503–507 (1995).

V. Shannon et al., "Study of the Material Properties and Suitability of Plasma–Deposited Fluorine–Doped Silicon Dioxides for Low Dielectric Constant Interlevel Dielectrics," *Thin Solid Films*, vol. 270, pp. 498–502 (1995).

T. Usami et al., "Low Dielectric Constant Interlayer Using Fluorine Doped Silicon Oxide," *Extended Abstracts of 1993 Intl. Conf. Solid State Devices and Mat.*, pp. 161–163 (1993).

T. Fukada et al., "Preparation of SiOF Films with Low Dielectric Constant by ECR Plasma Chemical Vapor Deposition," *Extended Abstracts of 1993 Intl. Conf. Solid State Devices and Mat.*, pp. 158–160 (1993).

J. Song et al., "Chemical and Electrical Characteristics of Low Temperature Plasma Enhanced CVD Silicon Oxide Films Using $Si_2H_6$ and $N_2O$," *Abstract Intl. Conf. Metallurgical Coatings* (Apr. 24–28, 1995).

J. Song et al., "Low Temperature Plasma Enhanced Chemical Vapor Deposition of Silicon Oxide Films Using Disilane and Nitrous Oxide," *J. Elec. Mat.*, vol. 24, pp. 1507–1510 (1995).

J. Song et al., "Chemical and Electrical Characteristics of Low Temperature Plasma Enhanced CVD Silicon Oxide Films Using $Si_2H_6$ and $N_2O$," *Thin Solid Films*, vol. 270, pp. 512–516 (1995).

J. Song et al., "Structural Properties of Low Temperature Plasma Enhanced Chemical Vapor Deposited Silicon Oxide Films Using Disilane and Nitrous Oxide," *Appl. Phys. Lett.*, vol. 67, pp. 2986–2988 (1995).

J. Song et al., "Effects of Native Oxide Removal from Silicon Substrate and Annealing on $SiO_2$ Films Deposited at 120° C by Plasma Enhanced Chemical Vapor Deposition Using Disilane and Nitrous Oxide," to be published in *J. Vac. Sci. and Technol. B.* (1996).

J. Song et al., "Low Temperature Plasma Enhanced Chemical Vapor Deposition of Fluorinated Silicon Oxide Films as an Interlayer Dielectric," unpublished manuscript (1996), pp. 1–15.

J. Song et al., "High Quality Fluorinated Silicon Oxide Films Prepared by Plasma Enhanced Chemical Vapor Deposition at 120° C," unpublished manuscript (1996), pp. 1–9.

LOW-TEMPERATURE PLASMA-ENHANCED CHEMICAL VAPOR DEPOSITION OF SILICON OXIDE FILMS AND FLUORINATED SILICON OXIDE FILMS USING DISILANE AS A SILICON PRECURSOR

This invention pertains to the chemical vapor deposition of silicon oxide films and fluorinated silicon oxide films, particularly at low temperatures.

Silicon dioxide is frequently used as an insulator or as a gate material on silicon-based integrated circuits. Typical applications of thin silicon dioxide films include protective coatings, gate insulators for field effect transistors, passivation or inter-metal layers for elemental and compound semiconductor devices, and capacitor dielectrics for memory devices. Heating a silicon wafer in the presence of oxygen at about 1000° C. can generate a silicon oxide layer on the wafer. But using such a high temperature has disadvantages, such as promoting unwanted diffusion, particularly diffusion of dopants in the wafer.

Plasma-enhanced chemical vapor deposition (PECVD) has been widely used in integrated circuit technology to deposit silicon dioxide ($SiO_2$) films at lower temperatures. In the PECVD process, a radio frequency (rf) glow discharge supplies part of the energy to promote a desired chemical reaction.

Silicon dioxide ($SiO_2$) films are typically made using silane ($SiH_4$) and a gaseous oxidant such as nitrous oxide ($N_2O$), typically at temperatures around 400° C. Semiconductor technologies are scaling down to submicron dimensions to meet device requirements for high speed, low power consumption, and high packing density. It would be desirable to manufacture these smaller device components using lower temperature processes. However, silicon dioxide films deposited from silane via PECVD below about 200° C. are of poor quality. There is a need for methods of depositing high-quality silicon dioxide ($SiO_2$) thin films at even lower temperatures.

The 400° C. temperature typically used for silane-based PECVD deposition of silicon dioxide films may be too high for some purposes, for example where GaAs or InSb components are used, and even 200° C. is too high for some purposes. Although silane is an effective silicon source, disilane ($Si_2H_6$) may be used as a silicon precursor at lower temperatures. However, previous methods for using disilane, such as laser-assisted deposition, and vapor deposition at 350° C., have not produced high-quality materials. No prior reference suggests that disilane may be used in a PECVD process for depositing silicon dioxide thin films at a temperature below 350° C.

Interlayer dielectric films with low dielectric constants that can be deposited at low temperatures are also desirable. Such films are useful to prevent degradation of device operating speed due to parasitic capacitances. A film that is commonly used for this purpose is fluorinated silicon oxide. Incorporation of fluorine into the Si—O lattice reduces its dielectric constant due to fluorine's high electronegativity and low polarizability. Incorporation of fluorine into silicon dioxide can also reduce radiation-induced oxide charges, and improve the hot-electron immunity of the dielectric. Previous approaches to depositing fluorinated silicon oxide films have included plasma enhanced chemical vapor deposition, electron cyclotron resonance plasma chemical vapor deposition, and atmospheric pressure chemical vapor deposition using Si precursors such as $SiF_4$, $FSi(OC_2H_5)_3$ or $Si(OC_2H_5)_4$ in presence of $NF_3$, $CF_4$, $N_2O$, or $C_2F_6$.

The following papers discuss the chemistry of disilane: F. Bozso et al, "Thermal and Electron-Beam-Induced Reaction of Disilane on Si(100)-(2×1)," *Phys. Rev. B.*, vol. 38, pp. 3943–3947 (1988); G. Perkins et al., "The 147-nm Photolysis of Disilane," *J. Am. Chem.*, vol. 102, pp. 3764–3769 (1980); Y. Ohshita, "Reaction of $Si_2H_6$ Molecule on a Silicon Surface," *J. Crystal Growth*, vol. 115, pp. 551–555 (1991); Y. Nara, "Synchrotron Radiation-Assisted Silicon Homoepitaxy at 100° C. Using $Si_2H_6/H_2$ Mixture," *Appl. Phys. Lett.*, vol. 61, pp. 93–95 (1992); and H. Hirayama et al., "Gas Source Silicon Molecular Beam Epitaxy Using Disilane;" *Appl. Phys. Lett.*, vol. 52, pp. 1484–1486 (1988).

The following papers discuss the deposition of silicon dioxide films from mixtures of silane with either nitrous oxide or oxygen: M. Tsuji et al., "Deposition of $SiO_2$ Films from ArF Laser Photolysis of $SiH_4/N_2O$ Mixtures," *Jpn. J. Appl. Phys.*, vol. 30, pp. 2868–2872 (1991); P. Pai et al., "Infrared Spectroscopic Study of $SiO_x$ Films Produced by Plasma Enhanced Chemical Vapor Deposition," *J. Vac. Sci. Technol. A*, vol. 4, pp. 689–694 (1986); J. Batey et al., "Low-temperature Deposition of High-Quality Silicon Dioxide by Plasma-Enhanced Chemical Vapor Deposition," *J. Appl. Phys.*, vol. 60, pp. 3136–3145 (1986); M. Ceiler et al., "Plasma-Enhanced Chemical Vapor Deposition of Silicon Dioxide Deposited at Low Temperatures," *J. Electrochem. Soc.*, vol. 142, pp. 2067–2071 (1995); M. Liehr et al., "Low Pressure Chemical Vapor Deposition of Oxide from $SiH_4/O_2$: Chemistry and Effects on Electrical Properties," *Appl. Phys. Lett.*, vol. 60, pp. 198–200 (1992); R. Chanana et al., "Effect of Annealing and Plasma Precleaning on the Electrical Properties of $N_2O/SiH_4$ PECVD Oxide as Gate Material in MOSFETs and CCDs," *Solid State Electronics*, vol. 36, pp. 1021–1026 (1993); and G. Lucovsky et al., "Deposition of Silicon Dioxide and Silicon Nitride by Remote Plasma Enhanced Chemical Vapor Deposition," *J. Vac. Sci. Technol. A*, vol. 4, pp. 681–688 (1986). G. Lucovsky et al. describe a system for the remote plasma enhanced chemical vapor deposition of $SiH_4/O_2$, $SiH_4/NH_3$, and $SiH_4/N_2$ systems, and briefly refer to preliminary experiments using $Si_2H_6$ in place of $SiH_4$.

The following papers discuss photo-induced chemical vapor deposition of silicon dioxide films using disilane: Y. Matsui et al., "Low-temperature Growth of $SiO_2$ Thin Film by Photo-Induced Chemical Vapor Deposition Using Synchrotron Radiation," *Jpn. J. Appl. Phys.*, vol. 31, pp. 1972–1978 (1992); K. Inoue et al., "Low Temperature Growth of $SiO_2$ Thin Film by Double-Excitation Photo-CVD," *Jpn. J. Appl. Phys.*, vol. 26, pp. 805–811 (1987); K. Inoue et al., "Growth of $SiO_2$ Thin Film by Selective Excitation Photo-CVD Using 123.6 nm VUV Light," *Jpn. J. Appl. Phys.*, vol. 27, pp. L2152–L2154 (1988); and M. Tsuji et al., "Deposition of $SiO_2$ Film from ArF Laser Photolysis of $Si_2H_6/N_2O$ Mixtures in a Parallel Irradiation Configuration," *Jpn. J. Appl. Phys.*, vol. 32, pp. 139–143 (1993).

The following papers discuss fluorinated silicon dioxide films: R. Laxman, "Low $\epsilon$ Dielectrics: CVD Fluorinated Silicon Dioxides," *Semiconductor International*, pp. 71–74 (May 1995); T. Usami et al., "Low Dielectric Constant Interlayer Using Fluorine-Doped Silicon Oxide," *Jpn. J. Appl. Phys.*, vol. 33, pp. 408–412 (1994); T. Homma et al., "A Room Temperature Chemical Vapor Deposition SiOF Film Formation Technology for the Interlayer in Submicron Multilevel Interconnections," *J. Electrochem. Soc.*, vol. 140, pp. 687–692 (1993); M. Shapiro et al., "CVD of Fluorosilicate Glass for ULSI Applications," *Thin Solid Films*, vol. 270, pp. 503–507 (1995); V. Shannon et al., "Study of the Material Properties and Suitability of Plasma-Deposited Fluorine-Doped Silicon Dioxides for Low Dielectric Constant Interlevel Dielectrics," *Thin Solid Films*, vol. 270, pp. 498–502 (1995); T. Usami et al., "Low Dielectric Constant Interlayer Using Fluorine Doped Silicon Oxide," *Extended Abstracts of 1993 Intl. Conf. Solid State Devices and Mat.*, pp. 161–163 (1993); and T. Fukada et al., "Preparation of SiOF Films with Low Dielectric Constant by ECR Plasma Chemical Vapor Deposition," *Extended Abstracts of 1993 Intl. Conf. Solid State Devices and Mat.*, pp. 158–160 (1993).

It has been unexpectedly discovered that high-quality $SiO_2$ films may be deposited at low temperatures by plasma-enhanced chemical vapor deposition using disilane ($Si_2H_6$) and nitrous oxide ($N_2O$) or oxygen ($O_2$) as silicon and oxygen precursors in an otherwise conventional reactor such as a parallel plate plasma reactor. The properties of the PECVD $SiO_2$ films deposited at 120° C. using $Si_2H_6$ and $N_2O$ were not significantly different from those of conventional $SiH_4$-based $SiO_2$ films deposited at the significantly higher temperature range 250°–350° C. PECVD deposition of $SiO_2$ films using $Si_2H_6$ and $N_2O$ provides a novel and practical low temperature process for fabricating microdevices and circuits. This low temperature process can be used for deposition in the presence of polymers, semiconductors, and other components that would melt, decompose, or otherwise be sensitive to higher temperatures.

It has also been discovered that fluorinated silicon oxide may be deposited at the relatively low temperature of 120° C. with plasma-enhanced chemical vapor deposition using a fluorine precursor such as $CF_4$ as a fluorine source in the novel silicon oxide deposition process from $Si_2H_6$ and $N_2O$. To the inventors' knowledge, incorporation of fluorine into a silicon dioxide film has not previously been accomplished at temperatures below about 250° C. The incorporation of fluorine maintains the physical properties of the films, while improving their electrical properties, such as reducing failures due to early dielectric breakdowns, enhancing performance as an insulator, and reducing the presence of unwanted electrical charges within the silicon dioxide lattice.

GENERAL EXPERIMENTAL CONDITIONS AND EQUIPMENT

Figure 1:
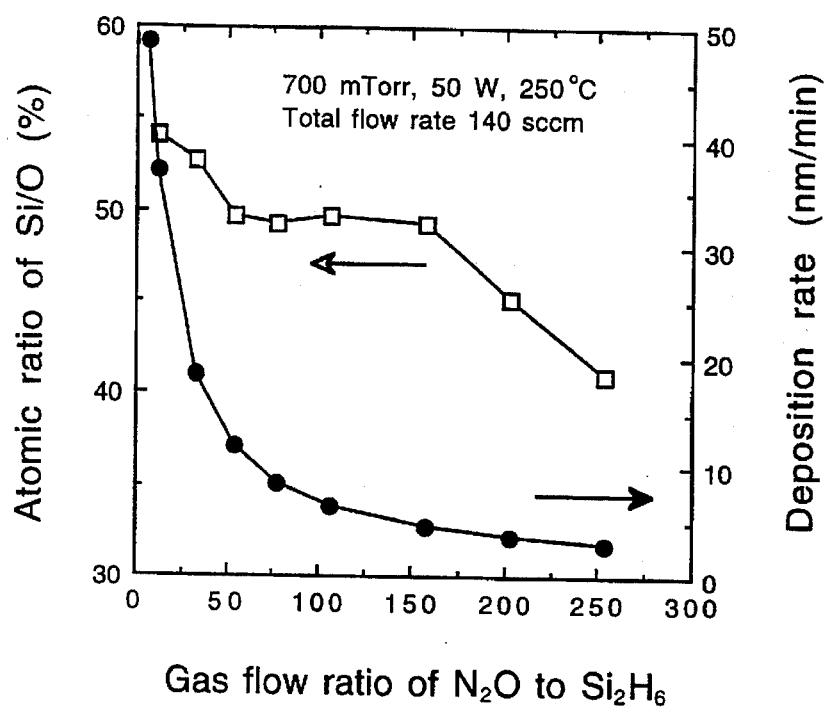
FIG. 1 depicts the atomic ratio of silicon to oxygen, and the deposition rate as a function of $N_2O/Si_2H_6$ gas flow ratio.

The general experimental conditions and equipment described in this section were used in all examples reported below, except as indicated otherwise for particular examples. Film deposition was conducted with a Plasma Therm model VII-70 PECVD system, which uses a 13.56 MHz rf source having 500 W maximum power output. The electrode spacing was held constant at 2.54 cm. The top electrode was maintained at 60° C., and the substrate at 120° C. (Alternatively, in lieu of an rf source, a low-temperature plasma may also be generated through electron cyclotron resonance via means known in the art.) Boron-doped, chemically-polished, 100 mm or 10 cm diameter, p-type, 5–20 Ω-cm silicon wafers with (100) orientation were used as the substrates. Film depositions were conducted without in-situ cleaning. After loading silicon wafers into the process chamber, the chamber was pumped to a base pressure of $1\times10^{-3}$ Torr. High purity $N_2O$ (99.99%) was then introduced into the chamber, followed by a mixture of 4.8% $Si_2H_6$ in helium. (Alternatively, in place of $N_2O$, $O_2$ may be used as the oxygen precursor.) Except as otherwise indicated, the following reaction parameters were used in each example reported below: total chamber pressure during deposition, 700 mTorr; total gas flow rate, 140 sccm ("standard cc per minute"); $N_2O$ to $Si_2H_6$ gas flow ratio 50; deposition power 50 W at 13.56 MHz. Where fluorine was incorporated, 0–48 sccm of $CF_4$ were also flowed through the deposition chamber, preferably 20 sccm. The flow rate ratios of $CF_4$ to $Si_2H_6$ ranged from 0 to 24. These conditions gave a deposition rate of 12.5 nm/min, and a thickness uniformity within ±3% across 10 cm diameter wafers.

Predeposition cleaning was performed with the conventional RCA two-step cleaning procedure. In the first step, the wafers were exposed for 5 minutes at 70° C. to a 5:1:1 solution of deionized water: 30% hydrogen peroxide solution: 30% ammonium hydroxide solution. The first step removed any organic surface films, and exposed the surface for decontamination reactions. In the second step, the rinsed wafers from the first step were exposed for 5 minutes at 70° C. to a 6:1:1 solution of deionized water: 30% hydrogen peroxide solution: 37% hydrochloric acid solution. The second step removed metallic contaminants that were not removed during the first step.

In some cases the RCA cleaning was followed by dipping in a dilute hydrofluoric acid solution containing 100 parts deionized water to 1 part of 48% HF solution.

Postdeposition annealing processes, where performed, were carried out in a conventional tube furnace flowing $N_2$ for 30 minutes.

Film compositions were measured by Auger electron spectroscopy (AES) on a Physical Electronics model PHI-48 instrument. A 100 nm thick $SiO_2$ film grown on silicon at 950° C. by dry thermal oxidation was used as a reference wafer to normalize the silicon and oxygen peaks.

Etch rates were measured by dipping a film for 1 min into P-etch solution, consisting of 15 parts by volume aqueous HF (48%), 10 parts by volume aqueous $HNO_3$ (70%), and 300 parts by volume $H_2O$.

The thickness of the films was measured by ellipsometry on an Applied Materials Ellipsometer II, and also with a Nanometrics 210XP thickness meter. The dielectric constant of deposited films was calculated from accumulation capacitance and conductance at high frequency (1 MHz) C-V measurements with an HP 4275A LCR meter. The ramp I-V characteristics were obtained with an HP 4140 voltage source and a Keithley 485 picoammeter.

Infrared transmission spectroscopic measurements were made on 200–220 nm thick films deposited on substrates that had not undergone any pre-deposition cleaning. Vibrational properties in the 400–4000 $cm^{-1}$ range were observed with a Perkin Elmer Fourier transform infrared spectrophotometer 1600 at a resolution of 4 $cm^{-1}$. A bare silicon wafer was used as the background reference.

Al gate MOS capacitors with a predefined area of $2.6\times 10^{-3}$ $cm^2$ were fabricated with standard photolithography techniques to investigate the dielectric properties of films annealed at different temperatures. Forming gas annealing with 5% $H_2$ in $N_2$ at 400° C. for 30 min was carried out as the post-metallization annealing (PMA) prior to capacitance-voltage (C-V) measurements.

C-V measurements were carried out by superimposing a 25 mV ac signal at 1 MHz with a HP 4275A LCR meter onto a dc voltage having a sweep rate of 1 V/sec. Observed capacitance values were corrected for the series resistance. I-V characteristics were obtained with an HP 4140 voltage source and a Keithley 485 picoammeter.

EXAMPLE 1

Experimental conditions were as described in the "General Experimental" Section above. The gas flow ratio was found to be important in determining the stoichiometry of the film. FIG. 1 depicts the atomic ratio of silicon to oxygen in the deposited films, and the film deposition rate as a function of the gas flow ratio of $N_2O$ to $Si_2H_6$. The ratio for stoichiometric $SiO_2$ depends on the process conditions used. For the conditions used in the experiment illustrated in FIG. 1, $N_2O/Si_2H_6$ ratios smaller than about 50 resulted in silicon-rich oxide films, while ratios in the range of about 50–150 gave nearly stoichiometric $SiO_2$ films with a ratio of atomic silicon to atomic oxygen of about 50%. At ratios higher than about 150, the film became oxygen-rich. An increase in $Si_2H_6$ concentration produced a higher film deposition rate, presumably due to an increase in the concentration of active species in the glow discharge.

EXAMPLE 2

Figure 2:
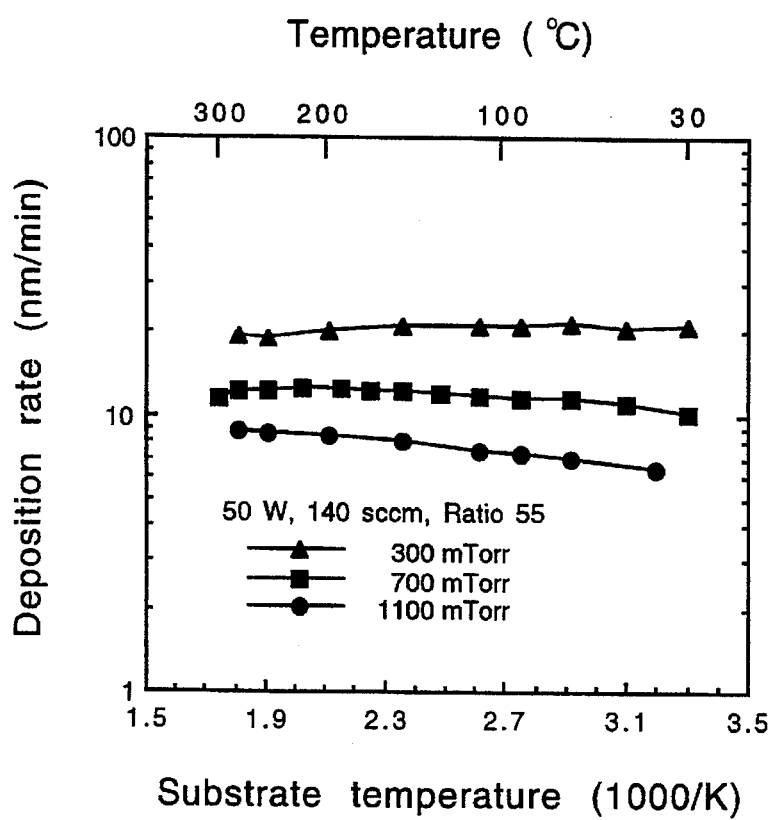
FIG. 2 depicts the Arrhenius behavior of deposition rate for $SiO_2$ films deposited at 300, 700, and 1100 mTorr process pressure.

Conditions were as described above for Example 1 except as otherwise indicated. The rf input power was 50 W, the total flow rate was 140 sccm, and the $N_2O/Si_2H_6$ flow ratio was 55. The dependence of film deposition rate on substrate temperature is illustrated in FIG. 2. Under these conditions the deposition rate was limited by mass transport. It is known that $Si_2H_6$ partially dissociates on a clean silicon surface, even below room temperature. This fact is consistent with the observation that the deposition rate was almost independent of temperature in FIG. 2. The peak deposition rates depended much more strongly on the process pressure, and were observed to be 22 nm/min and 14 nm/min at the pressures of 300 mTorr and 700 mTorr, respectively. Films deposited at lower deposition rates (7–15 nm/min) were found to have especially reproducible deposition properties, and to have a thickness that was uniform to within ±3% across the 10 cm diameter wafers.

EXAMPLE 3

Figure 3:
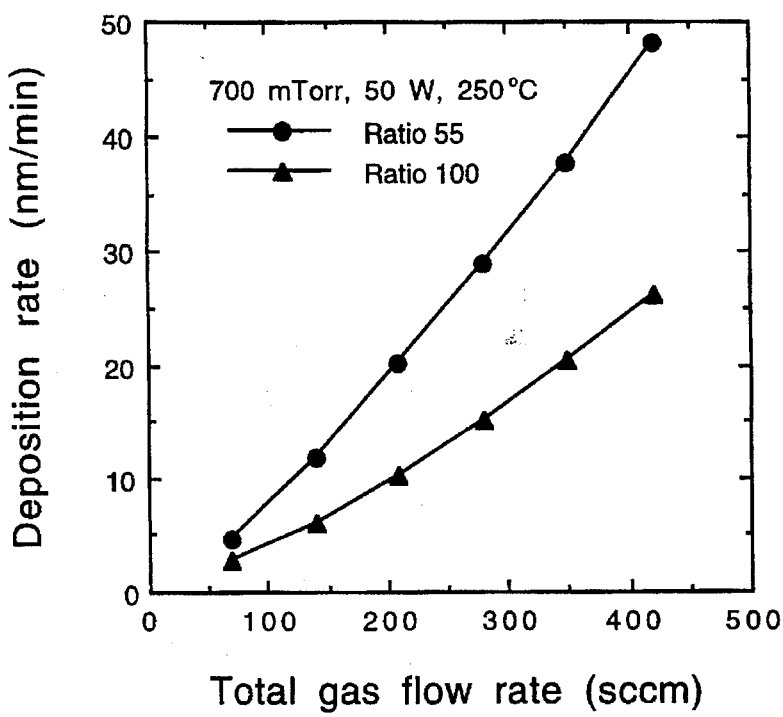
FIG. 3 depicts the dependence of deposition rate on total gas flow rate for $SiO_2$ films deposited with $N_2O/Si_2H_6$ gas ratios of 55 and 110.

Conditions were as described above for Example 1 except as otherwise indicated. The rf input power was 50 W, the chamber pressure was held at a constant 700 mTorr, and the substrate temperature was 250° C. FIG. 3 depicts the deposition rate as a function of the total gas flow rate at a constant $N_2O$ to $Si_2H_6$ flow rate ratio. The deposition rate increased significantly with increasing total flow rate at constant pressure, consistent with a process limited by gas phase mass transport.

EXAMPLE 4

Figure 4:
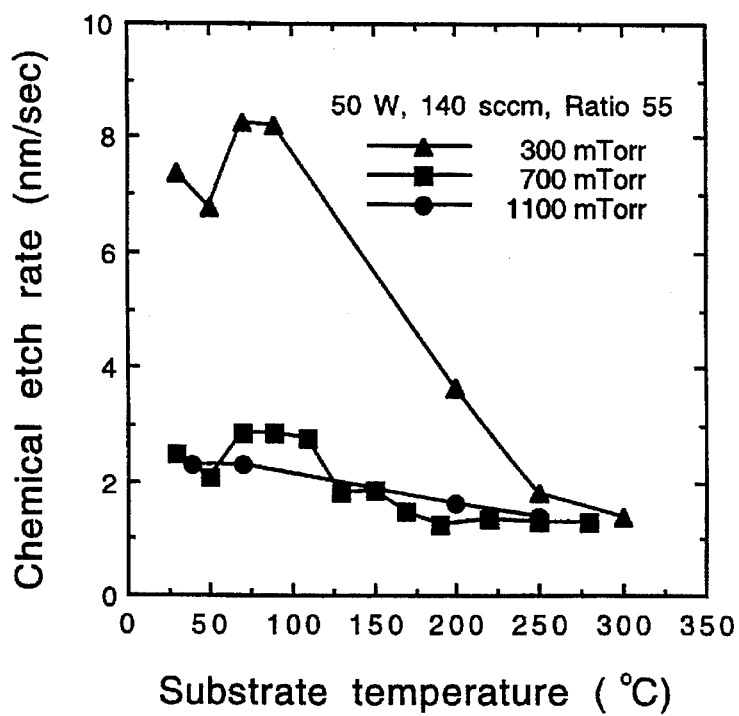
FIG. 4 depicts etch rate in P-etch solution as a function of substrate deposition temperature.

Conditions were as described above for Example 1 except as otherwise indicated. FIG. 4 depicts the film etch rate in P-etch solution as a function of substrate deposition temperature at 50 W rf power, a constant $N_2O/Si_2H_6$ ratio of 55, and constant gas flow rate of 140 sccm, at three different deposition pressures. The film integrity depended on the deposition temperature and pressure. The $SiO_2$ film deposited at room temperature at 300 mTorr etched at a rate of 7–8 nm/sec, four times faster than the etch rate for the film deposited at 250° C. at the same pressure (1.7 nm/sec). At a constant deposition pressure of 700 mTorr, the $SiO_2$ films deposited at room temperature had an etch rate of 2.5 nm/sec, about twice the etch rate of 1.3 nm/sec for the $SiO_2$ deposited at 250° C. The faster etch rate at the lower deposition temperature indicated a lower film integrity, which may be due to lower surface diffusion and rearrangement of active species on the substrate surface. For comparison, the P-etch solution etched $SiO_2$ films grown by conventional PECVD with $SiH_4$ at a rate of 1.6 nm/sec, suggesting that the film integrity of the $Si_2H_6$-based PECVD $SiO_2$ films deposited at 250° C. was comparable to that of the $SiH_4$-based PECVD films.

EXAMPLE 5

Figure 5:
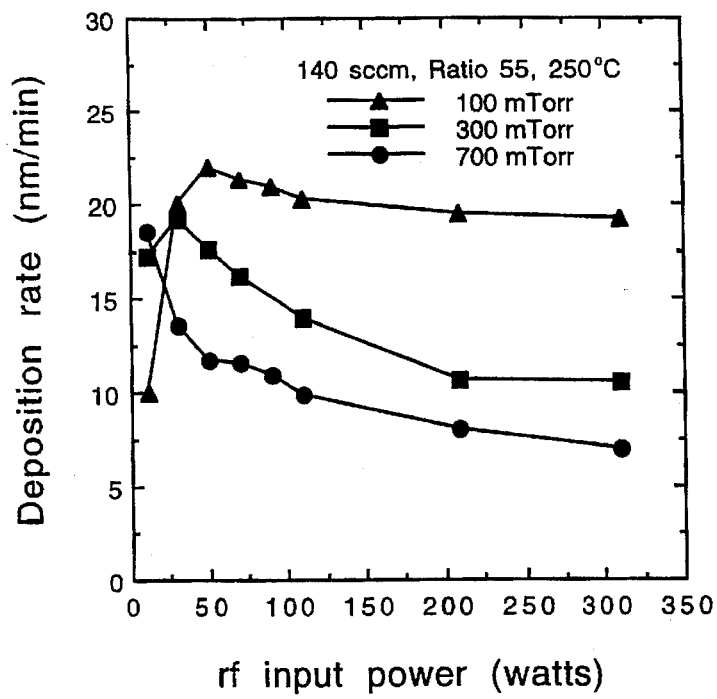
FIG. 5 depicts the deposition rate as a function of rf input power for $SiO_2$ films deposited at 100, 300, and 700 retort of process pressure.

Conditions were as described above for Example 1 except as otherwise indicated. FIG. 5 depicts the dependence of deposition rate on rf discharge power for three different pressure conditions. The substrate temperature was maintained at 250° C., total flow at 140 sccm, and the $N_2O/Si_2H_6$ ratio at 55. At low power (<30 W), the reaction was limited by the number of active radical species created in the glow discharge. The low chamber pressure caused an increase in the mean free path of the reactive species, causing a low deposition rate. As the rf power increased, the deposition rate increased, saturated, and then decreased. The decrease in deposition rate at higher power was attributed to the sputtering effects of bombarding species at higher energies.

EXAMPLE 6

Figure 6:
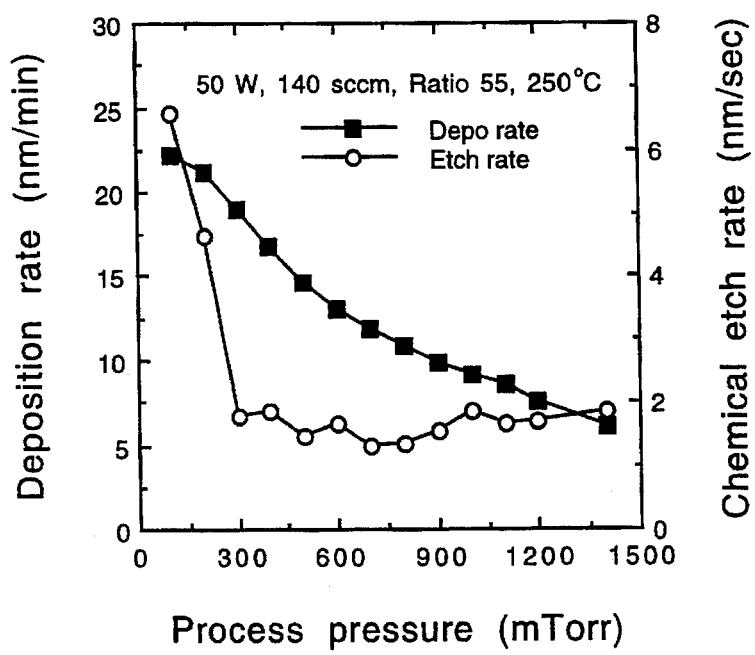
FIG. 6 depicts the process pressure dependence of the deposition and etch rates.

Conditions were as described above for Example 1 except as otherwise indicated. FIG. 6 depicts the deposition rate and etch rate as a function of process pressure. The deposition rate in the mass-transport-controlled regime was strongly dependent on total pressure, and was proportional to the diffusivity of the active radical species in the boundary layer. (Diffusivity in the boundary layer is inversely proportional to total pressure.) Increasing the pressure decreased the number of species arriving on the substrate surfaces, causing the deposition rate to drop from 22 nm/min at 100 mTorr to 6 nm/min at 1400 mTorr. The etch rate had a minimum value of 1.3 nm/sec for the $SiO_2$ films deposited at 700 mTorr, suggesting that rate was approximately the optimum process pressure for film density.

EXAMPLE 7

Experimental conditions were as described in the "General Experimental" Section above. The wafers for fabricating devices used in electrical measurements were cleaned by the standard RCA cleaning process, followed by a dip in dilute HF (100:1 by volume ratio of deionized (DI) water to 48% HF). The wafers were then rinsed in DI water and dried with $N_2$. Silicon oxide films of 100 nm thickness were deposited at different substrate temperatures within the 30°–150° C. temperature range. A 300 nm thick Al film was then thermally evaporated onto the silicon oxide films. MOS capacitors with predefined electrode areas were fabricated by wet etching Al using standard photolithography techniques. Gate electrode areas for the C-V and the I-V measurements were $2.73\times10^{-3}$ cm$^2$ and $8.310^{-3}$ cm$^2$, respectively. Post-metallization annealing was performed at 400° C. in $N_2$ for 30 minutes.

Figure 7:
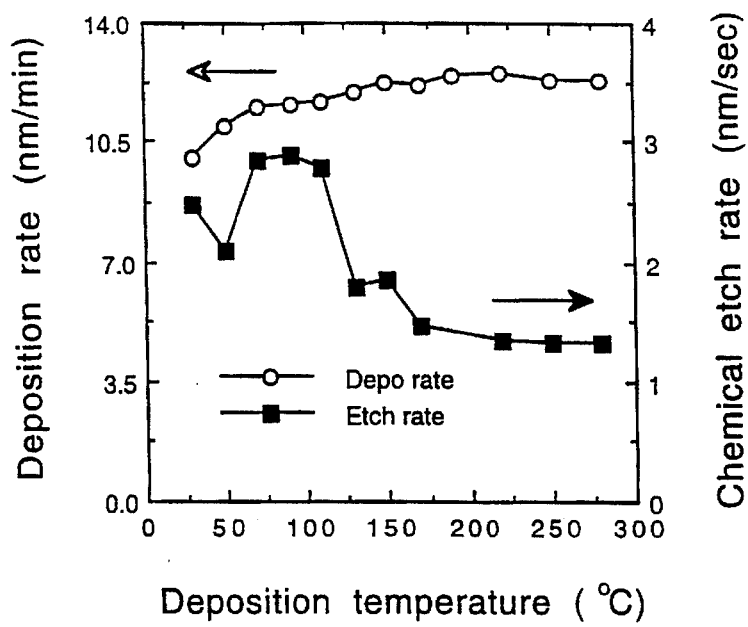
FIG. 7 depicts the deposition rate and etch rate of silicon oxide films as a function of deposition temperature.

FIG. 7 depicts the deposition rate and etch rate in the P-etch solution of the silicon oxide films as a function of deposition temperature. Deposition was a mass-transport-limited process, especially above 150° C., as is evident from the nearly temperature-independent deposition rate shown in FIG. 7. The faster etch rate for the films deposited at lower temperatures reflects a decrease in the film integrity, probably due to reduced surface diffusion and rearrangement of active species on the substrate surface. This mechanism may result in a higher density of hydroxyl bonds. The etch rate approached a constant value of 1.3 nm/sec for films deposited at 150° C. and above. The observed etch rate of 1.3 nm/sec is comparable to etch rates for silicon oxide films deposited by $Si(OC_2H_5)_4$/ozone CVD at 400° C.

EXAMPLE 8

Figure 8:
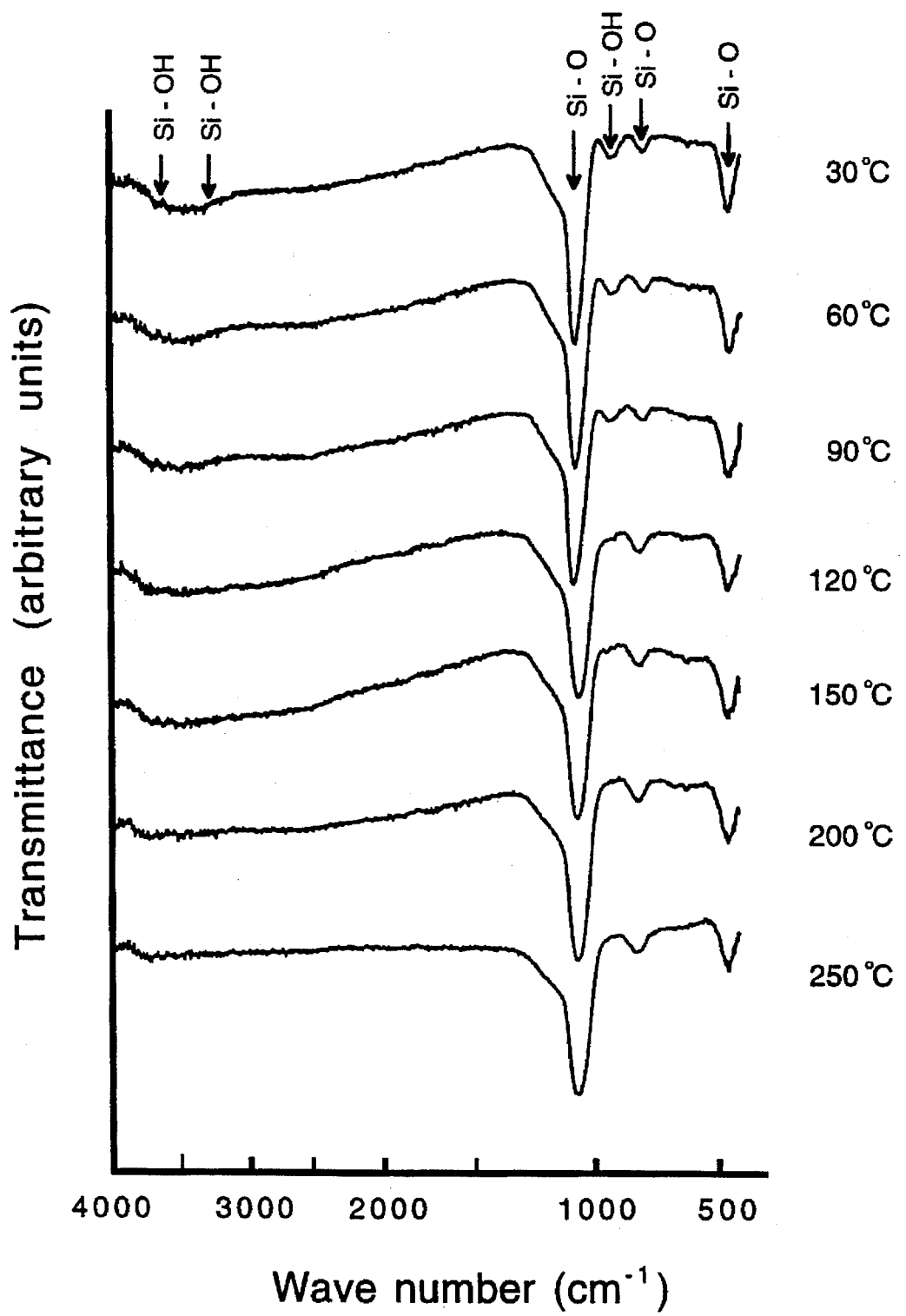
FIG. 8 depicts infrared transmission spectra of as-deposited silicon oxide films as a function of deposition temperature. The arrows indicate the location of absorption peaks in the vibrational spectra.

Conditions were as described above for Example 7 except as otherwise indicated. FIG. 8 depicts the infrared transmission spectra of silicon oxide films deposited at various deposition temperatures from 30° C. to 250° C. A decrease in the transmission intensity of hydroxyl bonds (Si—OH) at 3380–3620 cm$^{-1}$ and at 940 cm$^{-1}$ was observed with increasing deposition temperature. The gradual disappearance of the hydroxyl peaks with increasing deposition temperature was consistent with the observed increase in film integrity as reflected by the decrease in etch rate in FIG. 7.

EXAMPLE 9

Figure 9:
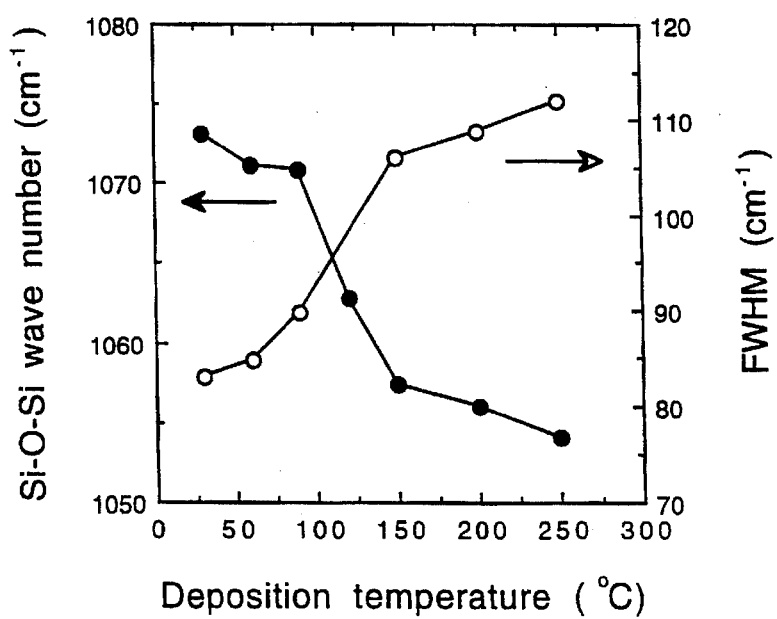
FIG. 9 depicts the Si—O—Si stretching absorption peak and FWHM of the as-deposited silicon oxide films shown in FIG. 8 as a function of film deposition temperature.

Conditions were as described above for Example 7 except as otherwise indicated. The infrared transmission spectrum for a stoichiometric silicon oxide film has three characteristic peaks at approximately 450, 800, and 1075 cm$^{-1}$, corresponding to Si—O—Si rocking, bending, and stretching vibrational modes, respectively. The vibrational mode associated with Si—O—Si stretching is frequently used to study the structural properties of the silicon oxide films. FIG. 9 depicts the frequency of the Si—O—Si stretching peak, and its full width at half maximum (FWHM) as a function of deposition temperature. As the deposition temperatures increased, the frequency of the Si—O—Si stretching decreased from 1073 cm$^{-1}$ to 1054 cm$^{-1}$, while the FWHM increased from 83 cm$^{-1}$ to 112 cm$^{-1}$. Shifts in the stretching frequency toward lower values, and increases in the FWHM are both associated with smaller values for the average inter-tetrahedral bond angle, an angle that is about 144° C. for thermally grown silicon oxide, and somewhat smaller for PECVD films. As the Si—Si distance is directly related to the Si—O—Si bond angle, changes in stretching frequency with compaction can be explained in terms of changes in the bond angle. By assuming that the density of silicon oxide scales inversely as the cube of the Si—Si distance, a decrease in the Si—O—Si bond angle corresponds to an increase in film density. From FIG. 8, the hydroxyl content decreased with increasing deposition temperature. A decrease in the Si—OH content is known to result in denser silicon oxide films produced by CVD, a relationship that presumably holds for films produced by PECVD as well.

EXAMPLE 10

Figure 10:
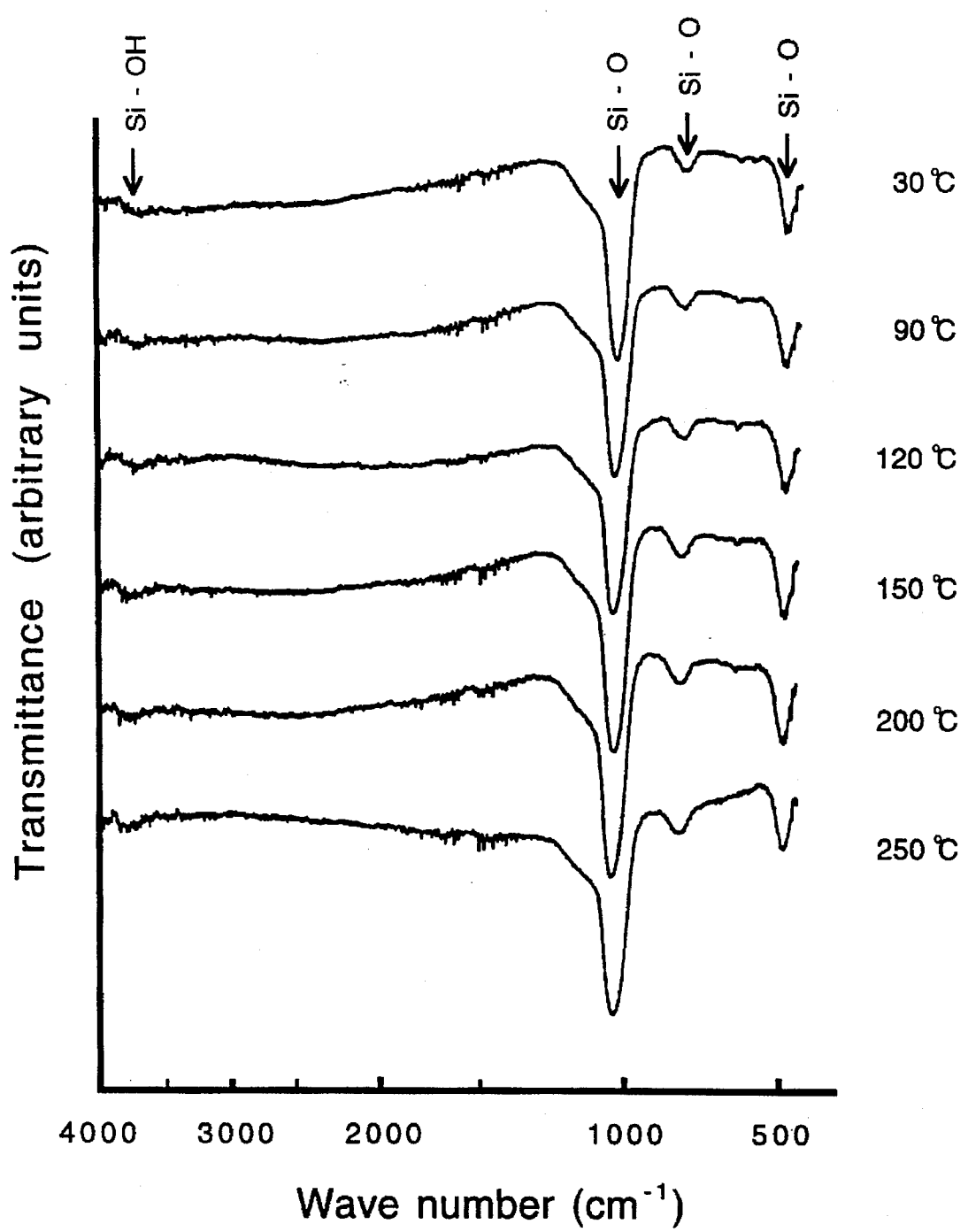
FIG. 10 depicts the infrared transmission spectra of annealed silicon oxide films as a function of film deposition temperature.

Conditions were as described above for Example 7 except as otherwise indicated. FIG. 10 depicts infrared transmission spectra as a function of deposition temperature after a conventional furnace annealing at 400° C. in N$_2$ for 30 min. In the annealed case, the hydroxyl peak at 940 cm$^{-1}$ nearly disappeared, even for the silicon oxide deposited at 30° C.

EXAMPLE 11

Figure 11:
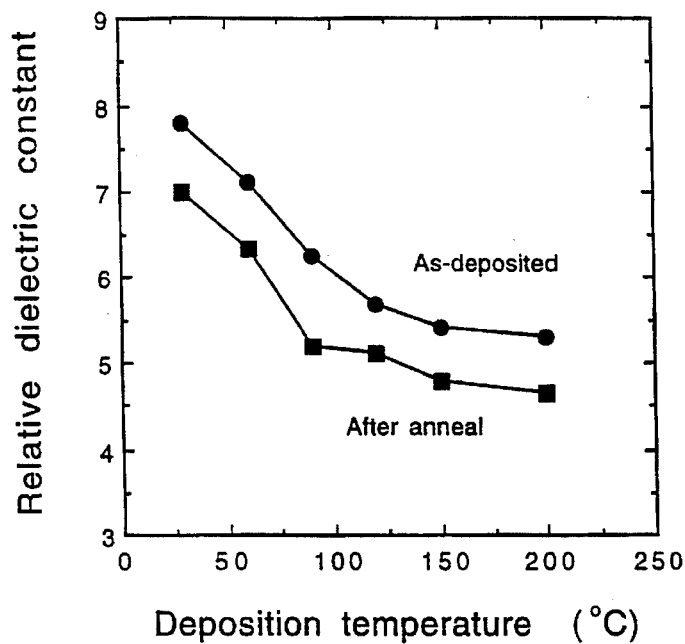
FIG. 11 depicts the dielectric constant of as-deposited and annealed silicon oxide films as a function of film deposition temperature.

Conditions were as described above for Example 10 except as otherwise indicated. FIG. 11 depicts the relative dielectric constants of the as-deposited and annealed silicon oxide films as a function of deposition temperature. The dielectric constant was calculated from the observed values of the capacitance in accumulation of MOS devices fabricated with the deposited films. The observed capacitance was corrected for series resistance.

The dielectric constant of an SiO$_2$ film is approximately proportional to its hydroxyl content. Hence the films deposited at lower temperatures, with higher Si—OH content, had higher dielectric constants. The dielectric constant of the as-deposited silicon oxide films decreased from 7.8 to 5.2 as the deposition temperature increased from 30° C. to 200° C. Similarly, the dielectric constant of the annealed silicon oxide films decreased from 7 to 4.6. Assuming that the annealing temperature at 400° C. was low enough not to change the thickness of the silicon oxide films, the decreased values of the dielectric constant indicated that even though the annealing was carried out after the gate electrode fabrication, the annealing was nevertheless able to reduce hydroxyl bonds at least partially. The smallest relative dielectric constant measured in this study, 4.6, was still higher than the corresponding value of 3.9 for thermally grown silicon oxide. The N$_2$ ambient gas used during annealing is chemically stable at 400° C., and should not have produced any significant degree of nitridation.

EXAMPLE 12

Figure 12:
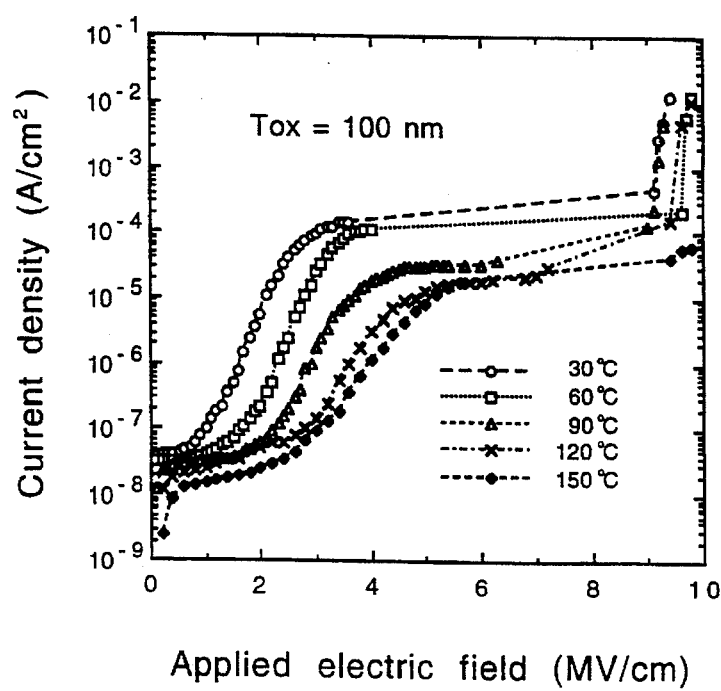
FIG. 12 depicts J-E characteristics of silicon oxide films for various deposition temperatures, with a film thickness of 100 nm and a gate area of $8.3 \times 10^{-3}$ $cm^2$.

Conditions were as described above for Example 7 except as otherwise indicated. FIG. 12 depicts time zero dielectric breakdown characteristics of silicon oxide films deposited at different deposition temperatures. The ramp I-V measurements were taken at 25° C., with the voltage ramping rate set at 1 V/s. The polarity of the field caused carrier accumulation at the substrate surface, which, for the p-type substrate used in this study, corresponded to electron injection from the Al gate. Current density J in the silicon oxide film as a function of the applied electric field E indicated higher leakage currents for films deposited at lower temperatures. However, the leakage current density of 5×10$^{-8}$ A/cm$^2$ at 0.5 MV/cm field strength for the silicon oxide film deposited at the lowest temperature of 30° C. is of the same order as that for the silicon oxide film deposited by PECVD using SiH$_4$ as the silicon source at 350° C. The J-E characteristics in FIG. 12 had generally similar features at all deposition temperatures shown. The current through the silicon oxide film saturated at high electric field, a phenomenon known as the "trapping ledge." The trapping ledge may be caused by the hydroxyl bonds acting as deep traps or as recombination centers. At about 10 MV/cm, intrinsic dielectric breakdown of the silicon oxide films occurred. For the film deposited at 150° C., the dielectric breakdown field was greater than 10 MV/cm.

EXAMPLE 13

Figure 13:
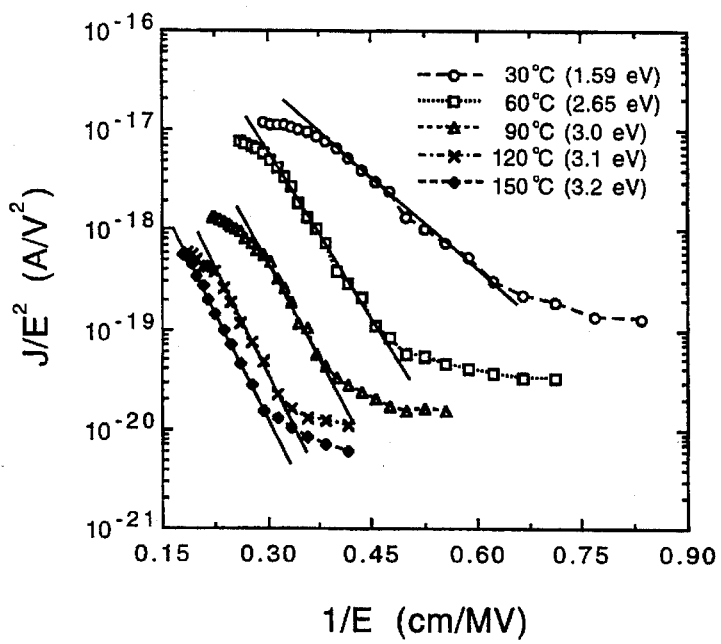
FIG. 13 depicts Fowler-Nordheim current plots for the silicon oxide films of FIG. 12. The linear dependence of $J/E^2$ on 1/E gives the barrier height indicated in the parentheses.

Conditions were as described above for Example 7 except as otherwise indicated. FIG. 13 depicts J/E$^2$ as a function of 1/E. The slope of this curve corresponds to a barrier height. The slope of the approximately linear part of this curve increased with increasing deposition temperature. Barrier height values of 3.1 eV and greater were obtained for the films deposited at 120° C. and above, close to the reported value of 3.2 eV. For the silicon oxide films deposited at 30° C., the observed barrier height of 1.59 eV was about half the reported value, indicating the existence of a large number of traps or energy states in the film.

EXAMPLE 14

Figure 14:
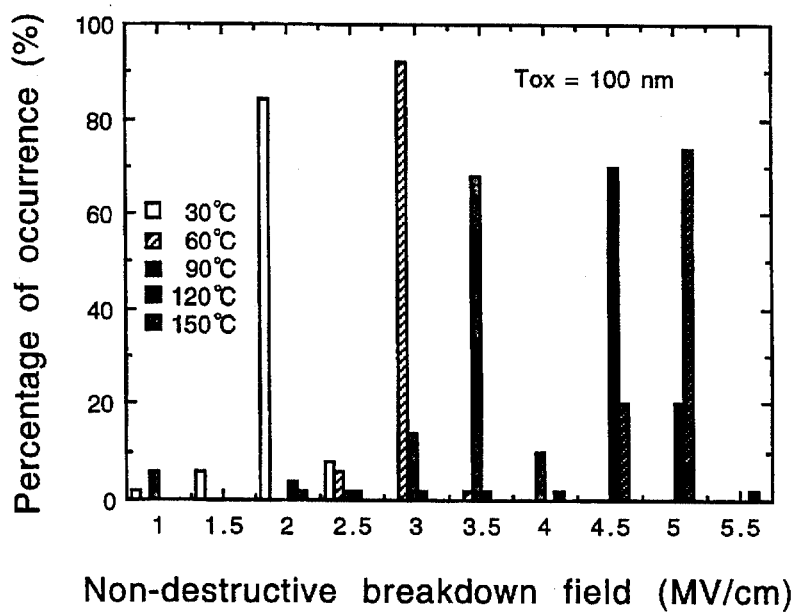
FIG. 14 depicts the distribution of non-destructive dielectric breakdown occurrence as a function of electric field for oxide films deposited at different temperatures.

Conditions were as described above for Example 7 except as otherwise indicated. FIG. 14 depicts the distribution of the non-destructive dielectric breakdown field for various deposition temperatures. In these measurements, a "non-destructive breakdown field" was defined as the electric field at which the current level reached 83 nA, equivalent to a current density of 10μA/cm$^2$. Fifty devices were measured for each case, and the voltage was increased at a ramp rate of 1 V/s, biasing the device towards accumulation. No initial device failures were observed such as might be caused by pinholes in the films. FIG. 14 shows a consistent distribution, with peaks occurring at higher values of the applied field as the film deposition temperature increased. The average value of the highest non-destructive breakdown field for the silicon oxide films deposited at 30° C. was 2.1 MV/cm. This value increased to 3.4 MV/cm for films deposited at 90° C.; to 4.5 MV/cm for films deposited at 120° C.; and to 4.8 MV/cm for films deposited at 150° C.

EXAMPLE 15

Figure 15:
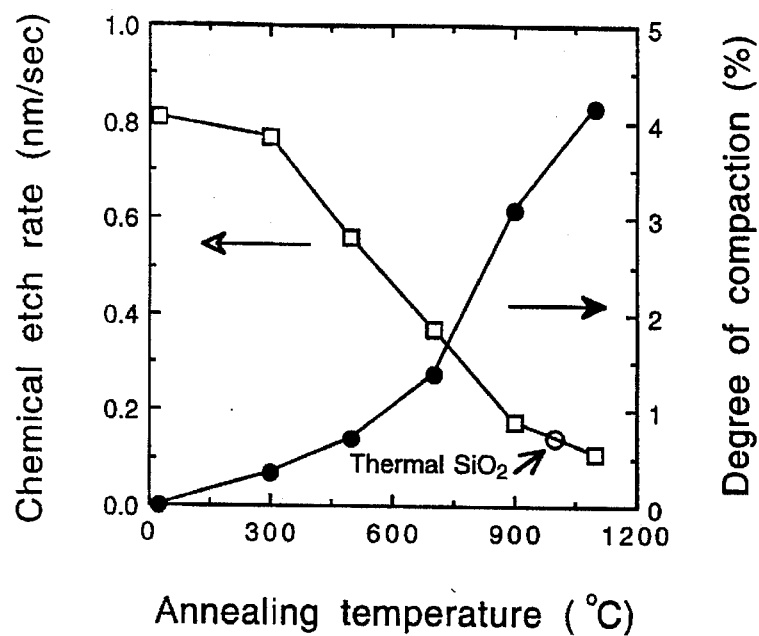
FIG. 15 depicts the percentage degree of compaction (●) and etch rate in P-etch solution (□) of $SiO_2$ films as a function of post-deposition annealing temperature. Experimental data at 25° C. are for the as-deposited film. The open circle near the lower right of the figure corresponds to etch rate of thermally-produced $SiO_2$ films grown at 1000° C., 0.15 nm/sec.

Experimental conditions were as described in the "General Experimental" Section above. FIG. 15 depicts the degree of compaction and the chemical etching rate in P-etch solution, both as functions of the post-deposition annealing temperature. The degree of compaction increased with increasing annealing temperature. The maximum compaction obtained in this study, about 4%, was observed at the highest annealing temperature used, 1100° C., a result consistent with measurements previously reported for $SiH_4$-based PECVD $SiO_2$ films. The chemical etching rate of the as-deposited $SiO_2$ films was found to be 0.81 nm/sec. As the annealing temperature increased, the etch rate decreased. The ratio of the etch rate for the as-deposited $SiO_2$ film to that for the annealed $SiO_2$ film at 1100° C. was 7.4. These higher etching rates indicated that the as-deposited $SiO_2$ films may have strained bonds, micropores, and crystalline lattice impurities. The stress-induced cracking that has been reported for other $SiO_2$ films during high temperature processing, particularly for films prepared at low temperatures, was not observed with the novel films even at 1100° C.

EXAMPLE 16

Figure 16:
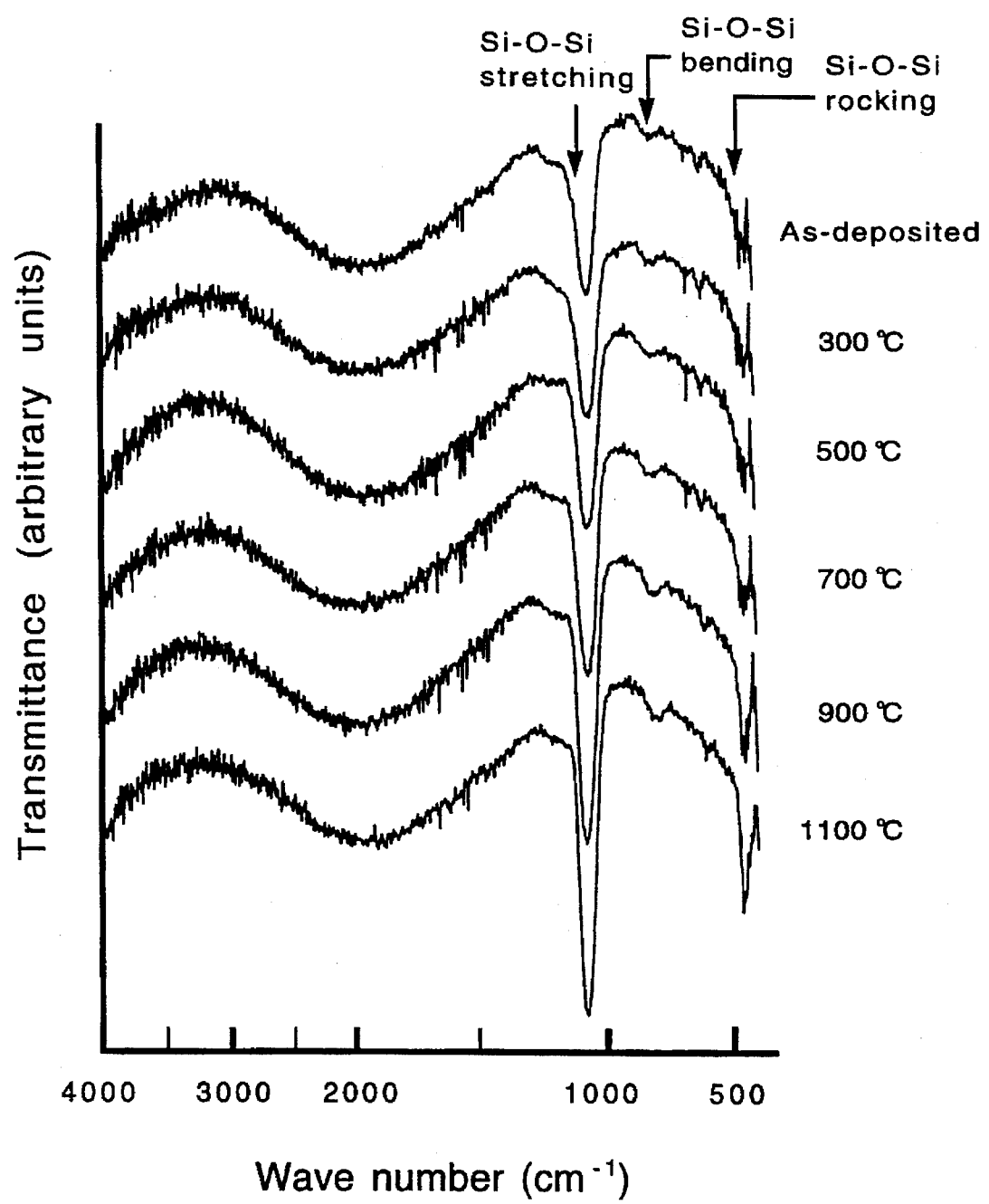
FIG. 16 depicts infrared transmission spectra of $SiO_2$ films annealed at different temperatures. Three characteristic peaks of Si—O—Si vibrational motion are marked.

Conditions were as described above for Example 15 except as otherwise indicated. FIG. 16 depicts infrared transmission spectra of $SiO_2$ films annealed at different temperatures. The characteristic Si—O—Si peaks at 1075 $cm^{-1}$, 800 $cm^{-1}$, and 450 $cm^{-1}$ were evident. Transmission intensities for hydrogen-containing bonds such as Si—H (2270 $cm^{-1}$, 880 $cm^{-1}$), Si—OH (3620 $cm^{-1}$), and $H_2O$ (1620 $cm^{-1}$) were below the spectrophotometer's detection sensitivity, indicating a bonded hydrogen content of less than 5 at. % in the films studied.

EXAMPLE 17

Figure 17:
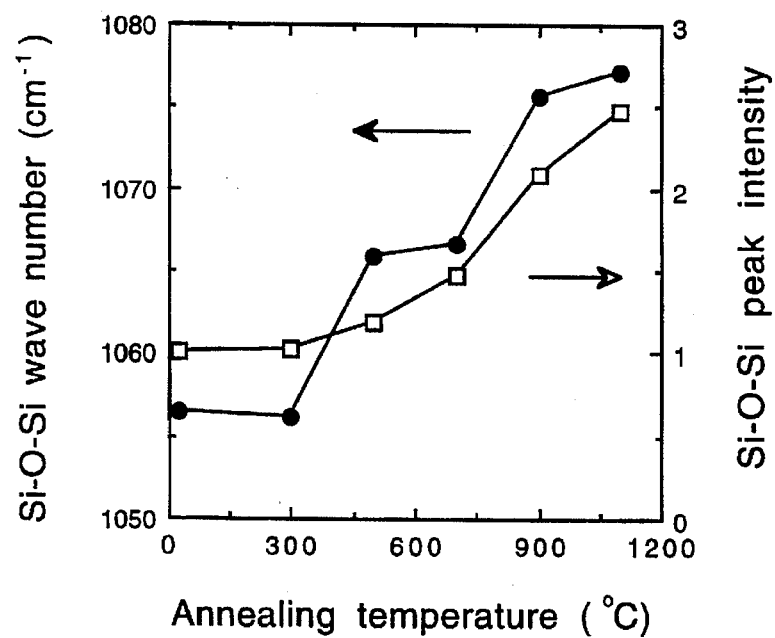
FIG. 17 depicts the frequency of the Si—O—Si asymmetric stretching (●) and its relative peak intensity with respect to as-deposited $SiO_2$ films (□) as a function of post-deposition annealing temperature.

Conditions were as described above for Example 16. FIG. 17 depicts the frequency of the Si—O—Si stretching peak, and its relative intensity, both as functions of annealing temperature. As the annealing temperature increased, the stretching peak frequency increased: for example, from 1056 $cm^{-1}$ for as-deposited $SiO_2$ films to 1077 $cm^{-1}$ for $SiO_2$ films annealed at 1100° C. Also, the relative intensity of the stretching peak increased with annealing temperature, and was as much as 2.5 times higher for films annealed at 1100° C. compared with as-deposited films.

EXAMPLE 18

Figure 18:
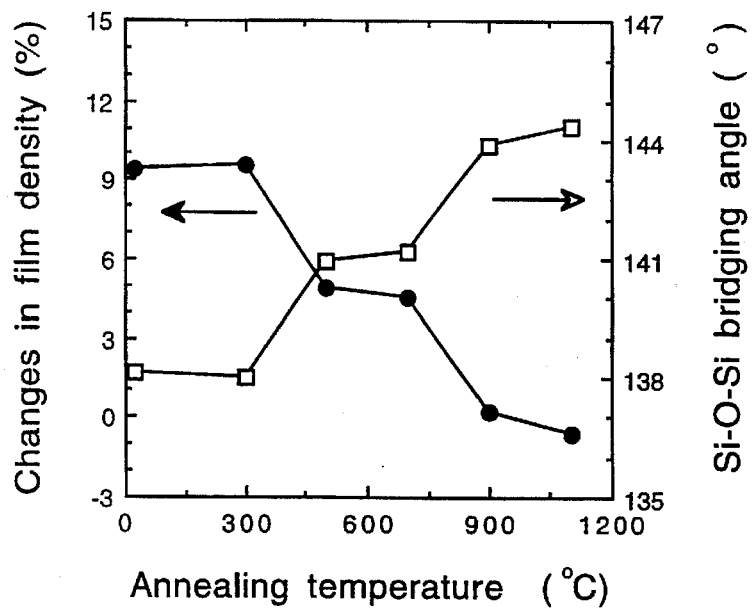
FIG. 18 depicts changes in the $SiO_2$ film density, $\Delta\rho/\rho$ (●), and Si—O—Si bridging bond angle, $\theta$ (□), as a function of post-deposition annealing temperature.

Conditions were as described above for Example 16. The position of the stretching peak angular frequency (ω) is related to the film density (ρ), dω/dρ=−93 $g^{-1}$ $cm^2$; and to the mean Si—O—Si bridging bond angle (θ), dθ/dρ=−28° $g^{-1}cm^3$. FIG. 18 depicts the changes in the film density (Δρ/ρ) and θ calculated using these relationships. The film density and Si—O—Si bridging bond angle of the as-deposited $SiO_2$ films were calculated to be 2.4 g/cm³ and 138°, respectively, corresponding to a 9.4% greater density for the as-deposited $SiO_2$ films. It is believed that high temperature annealing favors the relaxation of the $SiO_2$ film network, presumably by reduction of porosity and hydrogen-containing species.

EXAMPLE 19

Figure 19:
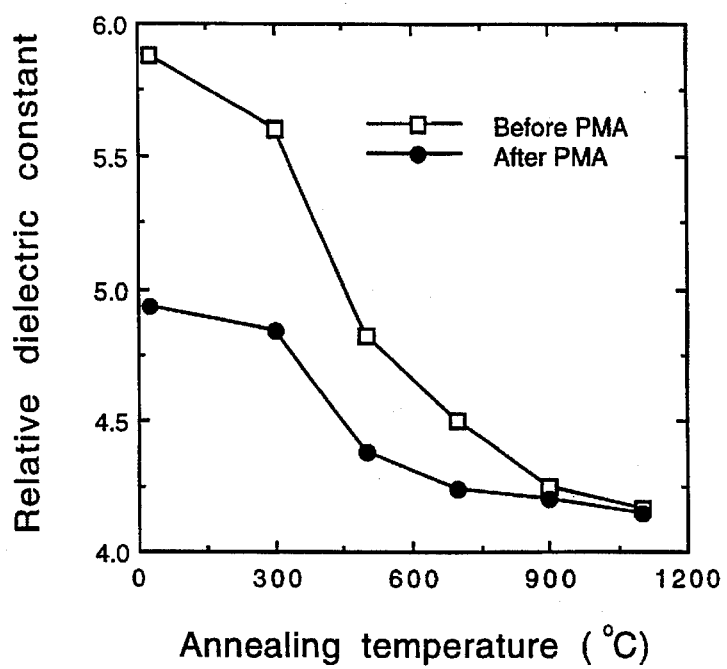
FIG. 19 depicts the dependence of the dielectric constant of $SiO_2$ films annealed at different temperatures on post-metallization annealing (PMA). The PMA was carried out in 5% $H_2$ in $N_2$ at 400° C. for 30 min.

Conditions were as described above for Example 16. FIG. 19 depicts the effect of high temperature annealing on the dielectric constant of the film as determined by C-V measurements. The dielectric constant was calculated from the measured values of the capacitance in the accumulation region of MOS devices with $SiO_2$ films, annealed as dielectric layers at various temperatures prior to Al evaporation. Increasing the annealing temperature reduced the dielectric constant of the $SiO_2$ films. The dielectric constant is approximately proportional to the OH content of an $SiO_2$ film, suggesting the presence of a smaller number of OH bonds in the $SiO_2$ films annealed at higher temperatures.

EXAMPLE 20

Experimental conditions were as described in the "General Experimental" Section above. After cleaning, substrate wafers were either loaded directly into the deposition chamber, or were subjected to an additional immersion in a dilute HF solution (100:1 by volume deionized water to 48% HF) before loading into the deposition chamber. The samples immersed in the dilute HF were rinsed with deionized water and dried with an $N_2$ jet.

Figure 20:
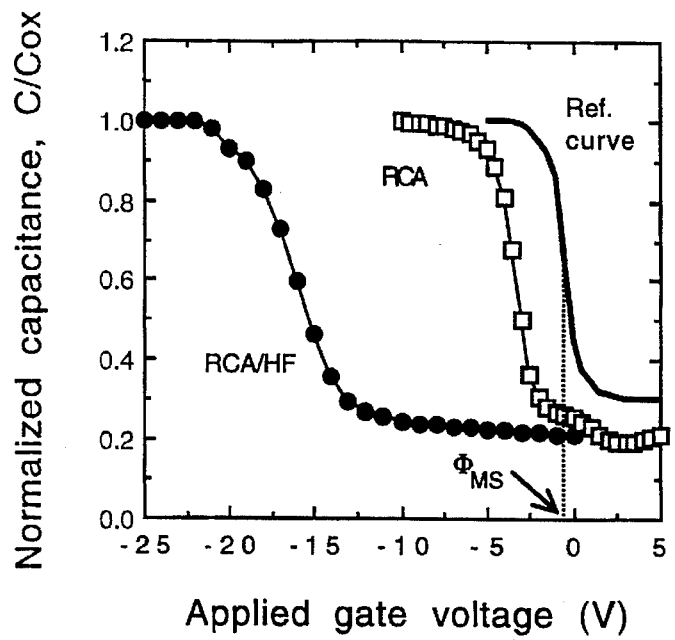
FIG. 20 depicts high-frequency normalized capacitance as a function of applied gate voltage for the RCA (□) and RCA/HF cleaning procedures (●). The reference curve marked a) is for $\Phi_{MS}=-0.83$ V, with no oxide or interface charges. Neither post-deposition nor post-metallization annealing was performed on these samples.

FIG. 20 depicts C-V curves for the devices on as-deposited $SiO_2$ films, both with and without the pre-deposition dip in the dilute HF. Neither post-deposition nor post-metallization annealing was performed before these measurements.

Four different types of charges are associated with an $SiO_2$—Si system. The overall effect of these charges is to shift the actual C-V curve with respect to the reference curve for a device having no charges. The work function difference between the gate material and the substrate was −0.83 V for the substrate doping used here. The devices on the films cleaned with the RCA procedure showed a flat band voltage ($V_{FB}$) of −3.66 V, corresponding to a flat band voltage shift ($\Delta V_{FB}$) of −2.83 V with respect to the reference curve in FIG. 20. The devices treated with the dilute HF solution RCA/HF treatment) to etch native oxide from the surface had a $\Delta V_{FB}$ of about −17 V. The C-V curve for the latter in FIG. 20 also showed a shape distortion as compared to the shape of the reference curve, a phenomenon referred to as "stretch-out." $\Delta V_{FB}$ may be used to calculate an effective oxide charge density ($Q_0$) at the $SiO_2$—Si interface from the relationship $Q_0 = -C_{ox}\Delta V_{FB}/q$, where $C_{ox}$ is the oxide capacitance per unit area, and q is the magnitude of the electron charge. The average values for $Q_0$ for the RCA and the RCA/HF cleaning procedures were $9.3 \times 10^{11}$ and $4.8 \times 10^{12}$ $cm^{-2}$, respectively.

The interface trap density ($D_{it}$) can be calculated by the high frequency C-V method developed by Terman. From the slope of the semiconductor surface potential ($\Psi_s$) versus the gate voltage ($V_G$), the interface trap capacitance $C_{it(\Psi_s)}$ per unit area is:

$$C_{it(\Psi_s)} = C_{ox}[(d\Psi_s/dV_G)^{-1}-1]-C_{s(\Psi_s)}$$

where $C_{s(\Psi_s)}$ is the semiconductor capacitance per unit area. The $D_{it}$ at the flat band condition is obtained from the equation:

$$D_{it(\Psi_s=0)} = C_{it(\Psi_s=0)}/q \text{ (in } cm^{-2} \text{ } eV^{-1}\text{)}.$$

The calculated interface trap densities for the RCA and the RCA/HF cleaning procedures were $5 \times 10^{11}$ and $2.4 \times 10^{12}$ $cm^{12}$ $eV^{-1}$, respectively. The samples with the native oxide etched from the surface prior to film deposition had an effective oxide charge density and interface trap density nearly five times higher than those for the samples with the native oxide. This difference may be attributed to interfacial bonding imperfections caused by energetic electron-induced bond breaking processes at the substrate surface; plasma-induced radiation can generate trivalent silicon species, which can form non-bridging oxygen sites to which hydrogen or fluorine atoms bond. These broken silicon bonds act as positive hole traps. Traps located at the $SiO_2$—Si interface play a critical role in making the C-V curves stretch out along the dc gate voltage axis, as seen in FIG. 20.

EXAMPLE 21

Figure 21:
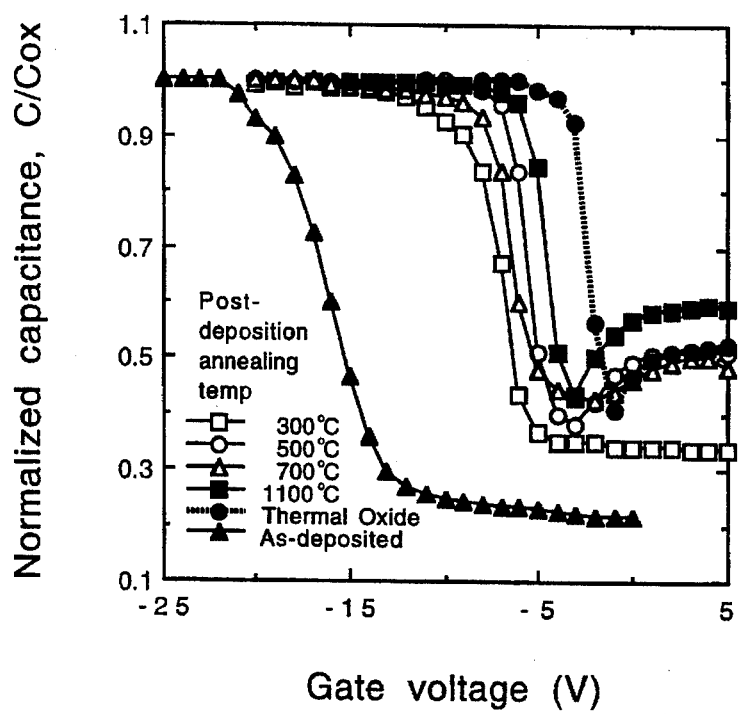
FIG. 21 depicts normalized high-frequency capacitance as a function of applied gate voltage for devices on RCA/HF-cleaned $SiO_2$ films with post-deposition annealing at different temperatures in $N_2$ for 30 min. For comparison, values for a thermal $SiO_2$ film grown at 1000° C. are also shown.

Conditions were as described above for Example 20. Because many device processes use a dip into a dilute HF solution as a final cleaning step before the film deposition process, the effects of annealing on the electrical properties of films cleaned with the RCA/HF procedure were investigated. Two different annealing processes were investigated: post-deposition annealing and post-metallization annealing. FIG. 21 depicts C-V curves for samples annealed at different post-deposition annealing temperatures. The C-V curves generally shifted towards the right along the voltage axis upon annealing, indicating a smaller magnitude for $Q_0$ in the films. The films also had smaller dielectric constants as the annealing temperature increased. An increase in capacitance in the annealed samples under strong inversion was attributed to lateral spreading of ac current over an area larger than the area of the gates alone. FIG. 21 also shows a decrease in stretch-out in the C-V curves along the voltage axis with increasing annealing temperature, giving almost the same capacitance gradient at flat band conditions as in the case of thermal $SiO_2$ grown at 1000° C. in our laboratory in dry $O_2$. (The C-V curve for the latter is also shown in FIG. 21.)

EXAMPLE 22

Figure 22:
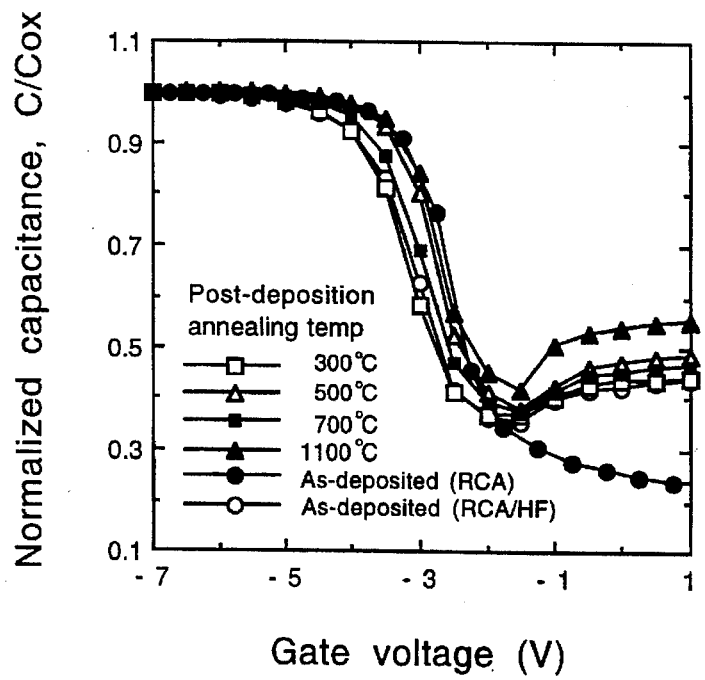
FIG. 22 depicts normalized high-frequency capacitance as a function of applied gate voltage for devices on $SiO_2$ films after post-metallization annealing in 5% $H_2$ in $N_2$ at 400° C. for 30 min. The values for RCA- and RCA/HF-cleaned, as-deposited films are also shown.

Conditions were as described above for Example 20. FIG. 22 illustrates the observed capacitance for the above samples after post-metallization annealing as a function of gate voltage. From the position of the C-V curves for the as-deposited films, it is evident that there were no hysteresis effects from the earlier post-deposition annealing of the samples. $V_{FB}$ for all samples was in the range $-3.15\pm0.4$ V, values that were close to $V_{FB}$ of $-3.06$ V for the films cleaned with the RCA procedure and subjected to the post-metallization annealing. This observation suggests that the effect of native oxide removal on charge distribution in the films can be minimized if the films are annealed in the ambient forming gas after metallization. However, all samples still showed an increase in inversion capacitance (capacitance when the MOS capacitor is in the inversion operating region). A bias-temperature (BT) stress test ($\pm5$ V bias at 200° C. for 20 min) was also performed on the as-deposited $SiO_2$ films cleaned with the RCA/HF procedure. The measured $V_{FB}$ difference before and after the BT test was 0.515 V, corresponding to a mobile ionic charge density of $1.7\times10^{11}$ $cm^{-2}$ in the films, almost the same as the value for the samples cleaned with the RCA procedure.

EXAMPLE 23

Figure 23:
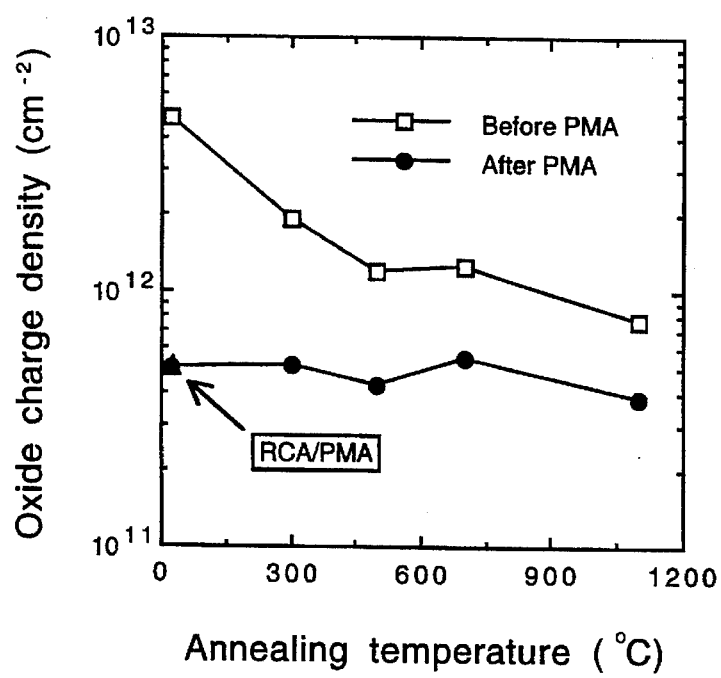
FIG. 23 depicts effective oxide charge density as a function of post-deposition annealing temperatures for $SiO_2$ films cleaned with RCA followed by a dip in dilute HF either before (□) or after (●) post-metallization annealing. Experimental data are for the as-deposited films at 25° C. The observed value after post-metallization annealing for the as-deposited films on RCA-cleaned substrates is also shown for comparison purposes (Δ).

The calculated effective oxide charge densities $Q_0$ for the samples of Examples 21 and 22 are illustrated in FIG. 23. Prior to the post-metallization annealing, the oxide charge density decreased with increasing post-deposition annealing temperature as discussed above, from $4.5\times10^{12}$ $cm^{-2}$ for the as-deposited $SiO_2$ films to $8\times10^{11}$ $cm^{-2}$ for the $SiO_2$ films annealed at 1100° C. This value is still large when compared to $2.8\times10^{11}$ $cm^{-2}$ we observed for the thermally-grown $SiO_2$ films. However, there was a significant reduction in the effective oxide charge density after the post-metallization annealing, resulting in a value of about $4-5\times10^{11}$ $cm^{-2}$, regardless of the conditions used for the post-deposition annealing. These observations suggest that annealing in a hydrogen-containing ambient atmosphere reduces the effective oxide charges more effectively than annealing in a nitrogen-containing ambient atmosphere, even at much higher temperatures. An interesting result was that no significant difference was observed in the effective oxide charge density after post-metallization annealing for the samples on the as-deposited $SiO_2$ films cleaned with the two different pre-deposition cleaning procedures. The observed effective oxide charge density following RCA cleaning was $4.3\times10^{11}$ $cm^{-2}$, while that for RCA/HF cleaning was $5\times10^{11}$ $cm^{-2}$.

EXAMPLE 24

Figure 24:
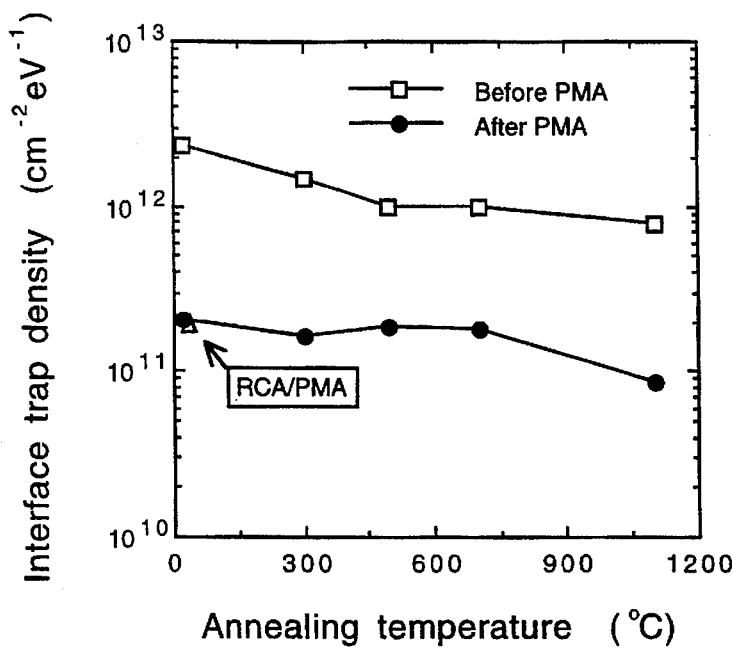
FIG. 24 depicts interface trap density under the flat band condition as a function of post-deposition annealing temperature before (□) and after (●) post-metallization annealing. Experimental data at 25° C. are for as-deposited films. The observed value after post-metallization annealing for the RCA-cleaned, as-deposited films is also shown for comparison purposes (Δ).

FIG. 24 depicts the calculated interface trap densities $D_{it}$ under the flat band condition (0.26 eV above the valence band edge) for the samples cleaned with the RCA/HF procedure, using the C-V curves from Examples 21 and 22. Post-metallization annealing in a $H_2$ ambient atmosphere passivated the interface trap charges more effectively than did post-deposition annealing in $N_2$, even at much higher temperatures. The calculated $D_{it}$ values following this cleaning procedure were on the order of $10^{12}$ and $10^{11}$ $cm^{-2}$ $eV^{-1}$ before and after the post-metallization annealing, respectively. The $D_{it}$ value was almost the same ($\sim 2\times10^{11}$ $cm^{-2}$ $eV^{-1}$) after the post-metallization annealing for the samples on the as-deposited films on RCA-cleaned substrates (i.e., with no HF dip). These results support the conclusion that annealing in a hydrogen-containing ambient atmosphere after metallization can reduce the interface state density, as well as oxide charges in the films. This hydrogen-related passivation was attributed to formation of Si—H bonds in the bulk oxide as well as at the interface. The hydrogen-related passivation resulted in an overall improvement in film quality.

EXAMPLE 25

Figure 25:
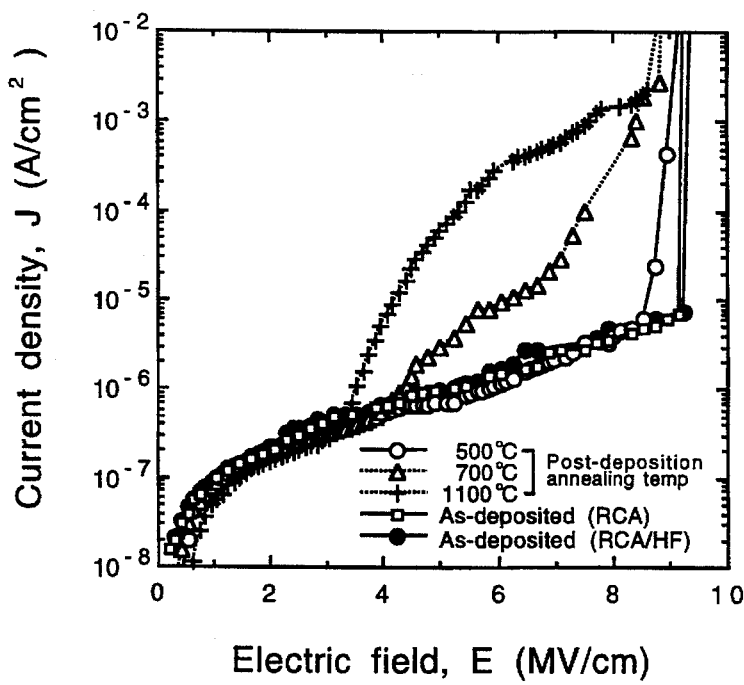
FIG. 25 depicts the J-E characteristics of the $SiO_2$ films for various post-deposition annexing temperatures followed by post-metallization annealing.

Conditions were as described above for Example 20. FIG. 25 depicts the ramp I-V characteristics of $SiO_2$ films for various post-deposition annealing temperatures, followed also by post-metallization annealing. The current conduction mechanism of the $SiO_2$ films at smaller values of electric field E ($\leq 3.5$ MV/cm) appeared to be identical for all cases, presumably dominated by the thermally excited electrons "hopping" from one isolated trap to another. For $SiO_2$ films with a post-deposition annealing temperature of 500° C. or lower, as well as for both pre-deposition cleaning procedures, the "hopping" mode of conduction dominated until catastrophic dielectric breakdown was reached. However, for $SiO_2$ films subjected to post-deposition annealing at 700° C. and higher, the current increased at about 3.5 MV/cm, above which there was an approximately linear relationship between $\ln(J/E^2)$ and $1/E$.

EXAMPLE 26

Figure 26:
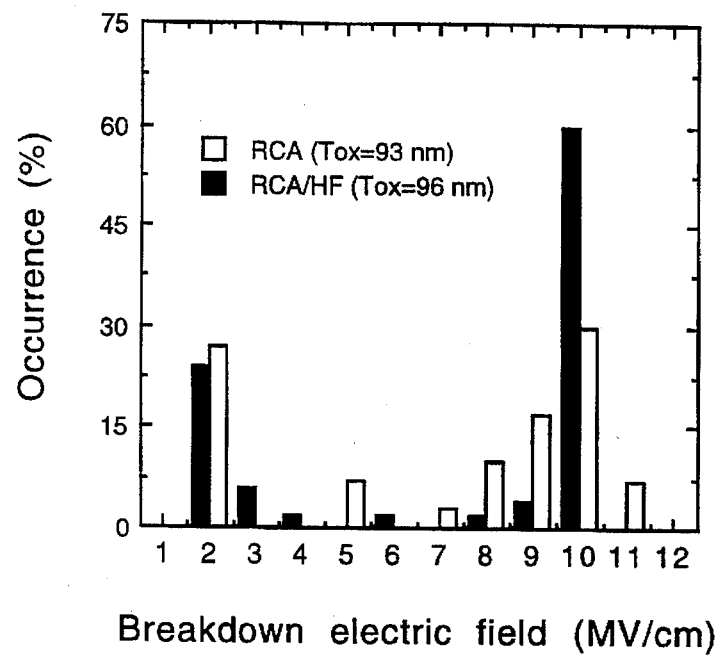
FIG. 26 depicts the observed distribution of occurrences of catastrophic dielectric breakdown as a function of electric field for as-deposited $SiO_2$ films cleaned with two different pre-deposition cleaning procedures. The measurements were performed after post-metallization annealing at 400° C. for 30 min in a forming gas ambient. "Tox" denotes oxide thickness.

Conditions were as described above for Example 20. FIG. 26 depicts the distribution of catastrophic dielectric breakdown fields for fifty devices on as-deposited SiO$_2$ films cleaned with both the RCA and the RCA/HF procedures. Measurements were made after the post-metallization annealing step. Measurements were taken at room temperature with the voltage increased at a ramp rate of 0.5 V/sec, with the gate biased negative with respect to the substrate. The distribution showed no significant differences for the two cleaning procedures, except that breakdowns for devices on film cleaned with the RCA procedure had a wider distribution, particularly at moderate values of the electric field. The early breakdown ($\leq 3$ MV/cm) seen for some 27%–30% of the samples was presumably caused by particles or micropores in the films. The intrinsic breakdown ($\geq 8$ MV/cm) percentages of samples cleaned with the RCA and the RCA/HF procedures were 64% and 66%, respectively. The measured average dielectric breakdown field was 7.1 MV/cm for the RCA procedure and 7.3 MV/cm for the RCA/HF cleaning procedure.

A summary of the dependence of SiO$_2$ film properties on pre-deposition cleaning procedures is given in Table I. The films deposited on the native oxide free surface showed five times more effective oxide charge and flat band interface trap densities than the films deposited on native oxide. The quality degradation caused by the native oxide removal from substrates prior to film deposition can be reduced by performing the post-metallization annealing at 400° C. in forming gas ambient atmosphere, resulting in no significant differences for characteristics of charge distribution and dielectric breakdown behavior.

istic peak of Si—O—Si asymmetric stretching motion located around 1075 cm$^{-1}$ was evident. The Si—F stretching peak at about 924 cm$^{-1}$ became more distinct and more intense as the ratio of CF$_4$ increased.

EXAMPLE 29

Figure 29:
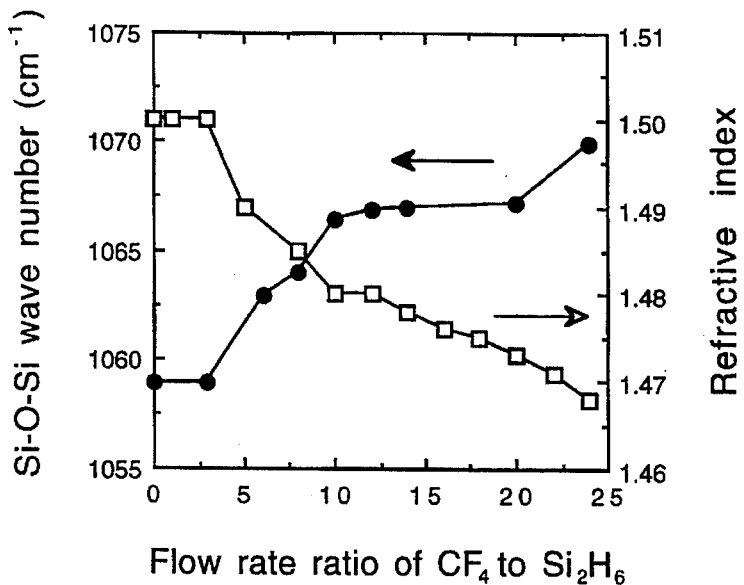
FIG. 29 depicts the Si—O—Si asymmetric stretching frequency (●) and refractive index (□) as a function of flow rate ratio of $CF_4$ to $Si_2H_6$ during film deposition.

Conditions were as described above for Example 28. The Si—O—Si stretching frequency, and the refractive index of the films are both depicted in FIG. 29 as functions of the flow rate ratio of CF$_4$ to Si$_2$H$_6$. As the CF$_4$ ratio increased, the peak frequency increased, from 1059 cm$^{-1}$ for films deposited at a ratio of 0, to 1070 cm$^{-1}$ for films deposited at a ratio of 24. The refractive index decreased from 1.50 for films deposited at a ratio of 0 to 1.468 for films deposited at a ratio of 24. For comparison, silicon oxide films grown by thermal oxidation in dry O$_2$ at 1000° C. had a peak frequency of 1076 cm$^{-1}$, and a refractive index of 1.46.

The Lorentz-Lorenz relationship links the refractive index n of the film to the film density $\rho$:

$$3M(n^2-1)=4\pi R\rho(n^2+2)$$

where R and M are the molecular polarizability and the molecular weight, respectively. If no significant change in the molecular weight M is assumed, then a decrease in either the film density or in the molecular polarizability will result in a decrease in the refractive index. Thus replacing Si—O bonds with Si—F bonds in the films had at least two distinct effects. First, incorporation of fluorine promoted structural

TABLE I

| Cleaning Process | Oxide charge density (cm$^{-2}$) | | Interface trap density at flat band (cm$^{-2}$ eV$^{-1}$) | | Dielectric breakdown (measured after PMA) | | |
|---|---|---|---|---|---|---|---|
| | As-deposited | After PMA[c] | As-deposited | After PMA[c] | E$_{av}$[b] in MV/cm | under 3 MV/cm | over 8 MV/cm |
| RCA | 9.3 × 10$^{11}$ | 4.3 × 10$^{11}$ | 5.0 × 10$^{11}$ | 1.9 × 10$^{11}$ | 7.1 | 27% | 64% |
| RCA/HF[a] | 4.8 × 10$^{12}$ | 5.0 × 10$^{11}$ | 2.4 × 10$^{12}$ | 2.0 × 10$^{11}$ | 7.3 | 30% | 66% |

[a]RCA/HF refers to cleaning in RCA, followed by a dip in a dilute HF solution.
[b]E$_{av}$ refers to the average catastrophic dielectric breakdown field.
[c]PMA refers to post-metallization annealing at 400° C. for 30 min in 5% H$_2$ in N$_2$ ambient.

EXAMPLE 27

Figure 27:
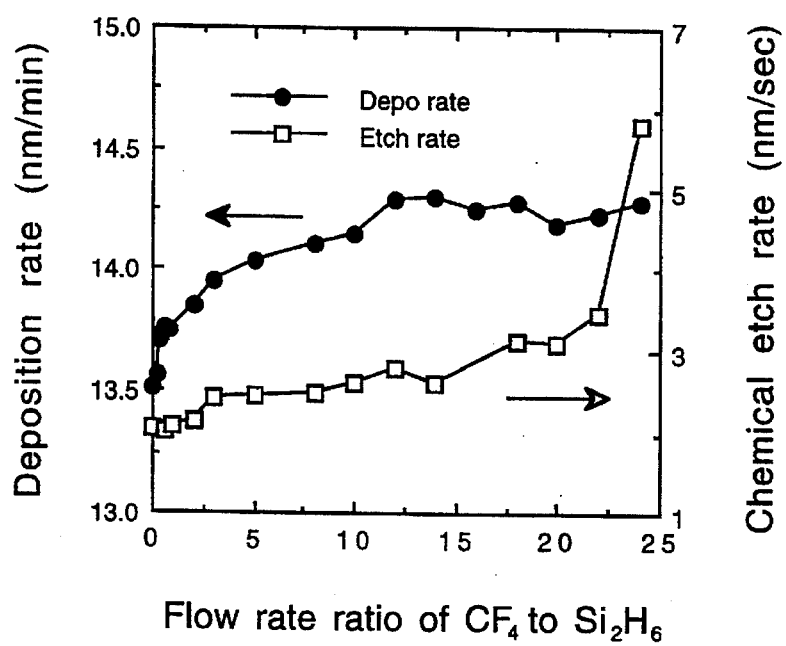
FIG. 27 depicts the deposition rate (●) and etch rate in the P-etch solution (□) of films as a function of the flow rate ratio of $CF_4$ to $Si_2H_6$ during film deposition.

Experimental conditions were as described in the "General Experimental" Section above. CF$_4$ was added to the disilane at varying rates. FIG. 27 depicts the film deposition rate and chemical etch rate in the P-etch solution as a function of the flow rate ratio of CF$_4$ to Si$_2$H$_6$. The deposition rate increased with increasing flow rate ratio until the flow rate ratio reached 12, after which it was approximately independent of gas flow ratio, with a value of about 14.3 nm/min. The deposition rate with zero CF$_4$ was about 13.5 nm/min. The film etch rate with zero CF$_4$ was approximately 2 nm/sec. As the flow rate ratio increased, the etch rate increased gradually to about 3.5 nm/sec at a flow rate ratio of 22, and then increased rapidly to 5.8 nm/sec for a flow ratio of 24. The higher etch rates reflect more highly strained bonds and more micropores in films with more fluorine incorporated into the Si—O lattice.

EXAMPLE 28

Figure 28:
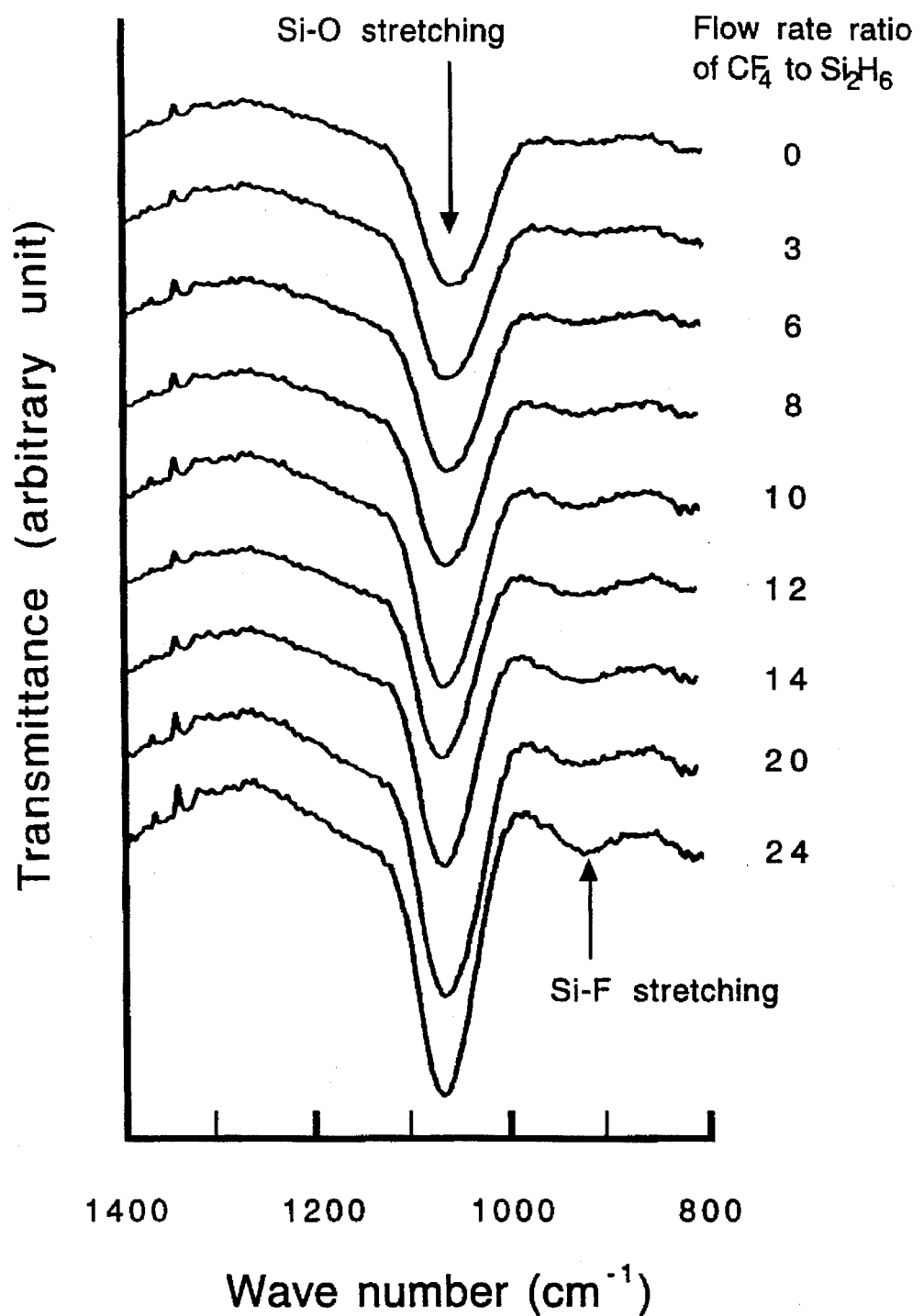
FIG. 28 depicts infrared transmission spectra for films deposited at various flow rate ratios of $CF_4$ to $Si_2H_6$.

Conditions were as described above for Example 27. FIG. 28 depicts infrared transmission spectra for films deposited at different flow rate ratios of CF$_4$ to Si$_2$H$_6$. The characterrelaxation of the film lattice, resulting in a decrease in film density as shown by the increase of the stretching frequency. Second, fluorine reduces film polarizability, resulting in a smaller dielectric constant. A linear plot of the Si—O—Si stretching peak frequency ($\omega$) versus the refractive index n for films deposited at different flow rate ratios gave dn/d$\omega$= $-2.9\times10^{-3}$ cm, somewhat higher than the comparable figure of $-1.7\times10^{-3}$ cm for silicon oxide films thermally grown at temperatures between 700° C. and 1000° C.

EXAMPLE 30

Figure 30:
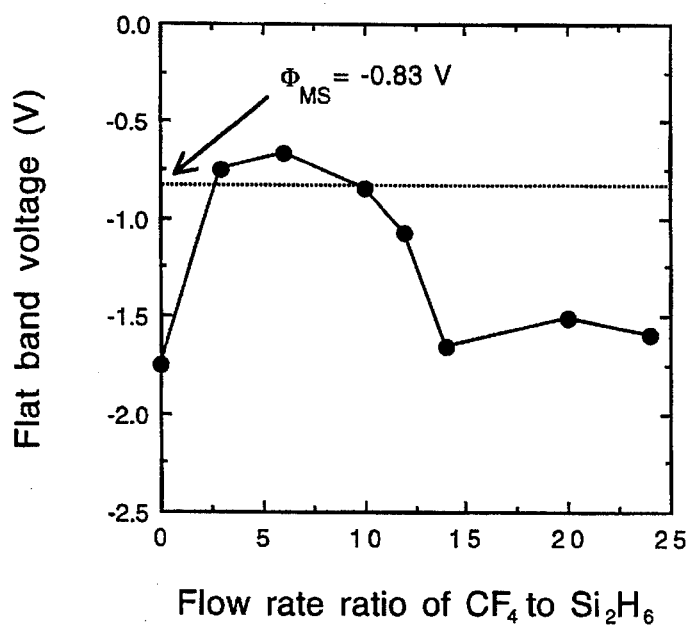
FIG. 30 depicts flat band voltage as a function of $CF_4$ to $Si_2H_6$ flow rate ratio during film deposition, with post-metallization annealing in 5% $H_2$ in $N_2$ at 400° C. for 30 min prior to measurement. The broken line indicates $\Phi_{MS}=-0.83$ V.

Conditions were as described above for Example 28. FIG. 30 depicts the effect of incorporating fluorine on the change in flat band voltage using C-V measurements. The devices on fluorine-free silicon oxide films had a flat band voltage of $-1.75$ V, corresponding to a flat band voltage shift of $-0.92$ V. As the amount of fluorine increased, the flat band voltage approached the value of the work function difference, indicating a decrease in the net effective positive charge density at the Si-insulator interface. However, films deposited at a flow rate ratio of 14 or higher had a flat band voltage returning to approximately the value for fluorine-free silicon oxide films, suggesting deterioration of the interface and the film from larger concentrations of fluorine.

EXAMPLE 31

Figure 31:
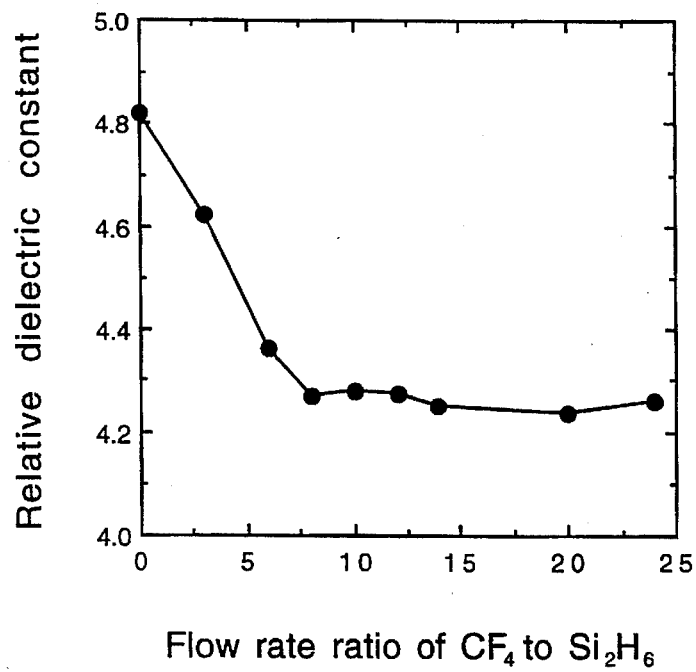
FIG. 31 depicts the dielectric constant of the films as a function of $CF_4$ to $Si_2H_6$ flow rate ratio.

Replacement of Si—OH bonds with Si—F bonds drove the film dielectric constant to lower values. Conditions were as described above for Example 28. FIG. 31 depicts calculated relative dielectric constants as a function of the $CF_4$ to $Si_2H_6$ flow rate ratio, based on the measured values of the capacitance in the accumulation region of MOS devices. The dielectric constant of films deposited at flow ratio of 0 (fluorine-free silicon oxide) was 4.82. An increase in the flow rate ratio up to about 8 resulted in a reduction in the dielectric constant; above a flow rate ratio of about 8 the dielectric constant had a nearly constant value of 4.25, 12% lower than the dielectric constant for the fluorine-free silicon oxide films. The minimum value of 4.25 was close to the value of 4.16 for fluorine-free silicon oxide films deposited at 120° C. by PECVD and annealed at 1100° C.

From the results of both the flat band voltage and the dielectric constant measurements, a preferred $CF_4$ to $Si_2H_6$ flow rate ratio is in the range of 8–10, corresponding to 16–20 sccm of $CF_4$ for 2 sccm of $Si_2H_6$ flow in the deposition chamber used in these examples.

EXAMPLE 32

Figure 32:
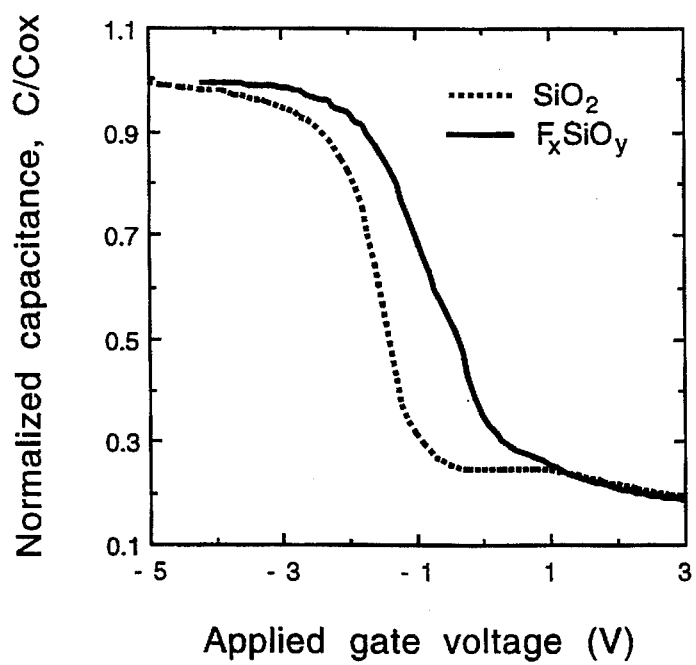
FIG. 32 depicts high-frequency normalized capacitance as a function of applied gate voltage for devices on silicon oxide and fluorinated silicon oxide films.

Conditions were as described above for Example 28, with a 20 sccm flow rate of $CF_4$. FIG. 32 depicts C-V curves for silicon oxide and fluorinated silicon oxide films. The devices on the silicon oxide films without fluorine showed a flat band voltage ($V_{FB}$) of −1.75 V, corresponding to an additional flat band voltage shift ($\Delta V_{FB}$) of −0.92 V after accounting for the contribution from the work function difference. The devices on the fluorinated silicon oxide films had a smaller $V_{FB}$, about −1 V. The C-V curve for the fluorinated films showed a slight distortion along the voltage axis referred to as stretch-out, particularly near the accumulation and depletion regions. This distortion is believed to be associated with donor-type interface traps in the lower half of the energy band gap. An effective oxide charge density ($Q_0$) at the interface can be calculated from the relationship $Q_0=-C_{ox}\Delta V_{FB}/q$, where $C_{ox}$ is the oxide capacitance per unit area, and q is the magnitude of the electron charge. The $Q_0$ values for silicon oxide and fluorinated silicon oxide films were $2.56\times10^{11}$ cm$^{-2}$ and $4.12\times10^{10}$ cm$^{-2}$, respectively. These figures indicated that the oxide charges for the fluorinated silicon oxide films decreased by a factor of about ⅙ compared to those for the silicon oxide films. This decrease may be attributed to replacement of hydroxyls, or to defect-related fluorine bondings in the oxide lattice.

EXAMPLE 33

Figure 33:
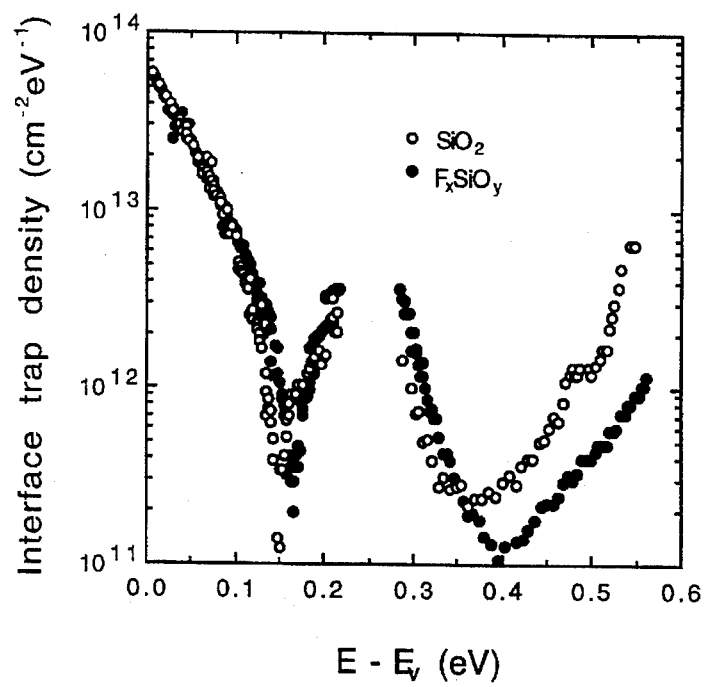
FIG. 33 depicts interface trap density as a function of the energy level location relative to the majority carrier band edge ($E_v$) for silicon oxide and fluorinated silicon oxide films.

Conditions were as described above for Example 32. FIG. 33 depicts calculated interface trap densities for the silicon oxide and fluorinated silicon oxide films as a function of the energy level location from the majority band edge $E_v$. The measured interface trap density distributions followed a generally W-shaped curve having two minima. For the fluorinated silicon oxide films, the two minima were $1.99\times10^{11}$ cm$^{-2}$ eV$^{-1}$ at 0.165 eV, and $1.07\times10^{11}$ cm$^{-1}$ eV$^{-1}$ at 0.395 eV, both measured from the top of the valence band. For the silicon oxide films, the two minima were $1.25\times10^{11}$ cm$^{-2}$ eV$^{-1}$ at 0.15 eV, and $2.13\times10^{11}$ cm$^{-2}$ eV$^{-1}$ at 0.36 eV. The interface trap density values for the fluorinated silicon oxide films in the energy range (E–$E_v$) of 0.15 eV and lower were slightly higher than the corresponding values for silicon oxide films, and in the range of 0.35–0.55 eV were slightly lower. These observations were consistent with the observed shapes of the C-V curve.

EXAMPLE 34

Figure 34:
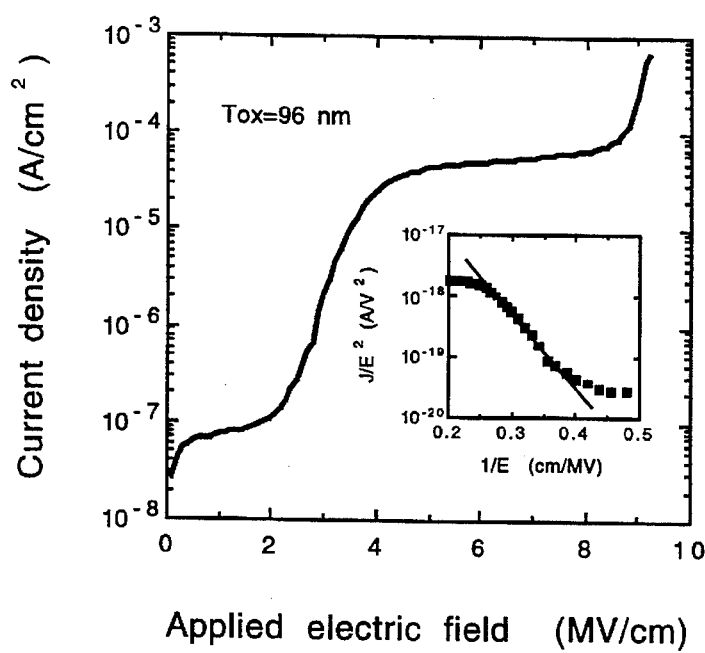
FIG. 34 depicts typical J-E characteristics of fluorinated silicon oxide films with a thickness of 96 nm. The voltage ramp rate was fixed at 0.5 V/see, and the bias polarity corresponded to electron injection from the gate. The inserted figure is a plot of $\ln(J/E^2)$ vs $1/E$.

Conditions were as described above for Example 32. FIG. 34 depicts a typical I-V characteristic curve for a MOS structure fabricated on a fluorinated silicon oxide film. A displacement current dominated at low electric fields (<2 MV/cm). The onset of current injection occurred at an electric field of about 2 MV/cm. The electric field that drove the films into intrinsic breakdown phenomenon began at about 8.5 MV/cm. The inserted plot in FIG. 34 depicts a linear range for $\ln(J/E^2)$ versus 1/E, a relationship consistent with the simple Fowler-Nordheim mechanism. The measured value of the slope was about 2.88 eV, somewhat smaller than the 3.2 eV value corresponding to the barrier height; this value may indicate an additional tunneling component from the metal gate to the silicon conduction band.

EXAMPLE 35

Figure 35:
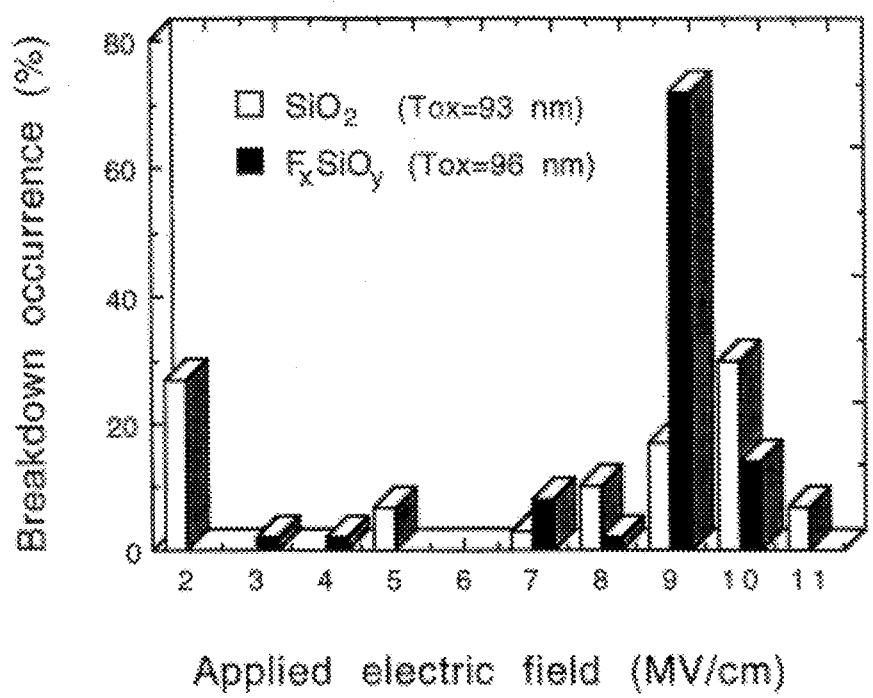
FIG. 35 depicts the distributions of dielectric breakdown occurrences as a function of electric field strength for silicon oxide and fluorinated silicon oxide films.

Conditions were as described above for Example 32. FIG. 35 depicts distributions of the destructive dielectric breakdown field strength for both fluorinated and unfluorinated silicon oxide films. Fifty devices were used in each of these measurements. Early breakdowns at field values less than 3 MV/cm were observed for 28% of the devices on silicon oxide films, and on 2% of the devices on fluorinated silicon oxide films. At the higher end, 88% of devices on the fluorinated silicon oxide films had a breakdown field strength of 8 MV/cm or higher, compared to only 64% for the devices on silicon oxide films. The measured average dielectric breakdown field strength for the fluorinated silicon oxide films was 8.9 MV/cm, compared to 7.1 MV/cm for devices on the silicon oxide films. Thus significantly fewer devices on fluorinated silicon oxide films experienced early dielectric breakdowns; and an overall shift of the breakdown distribution to higher electric field values was observed. The addition of fluorine to silicon oxide films significantly improved film quality by substantially reducing the incidence of early dielectric breakdown failures.

Miscellaneous

The following papers present the work of the inventors and a collaborator, and are not prior art to the present application: J. Song et al., "Chemical and Electrical Characteristics of Low Temperature Plasma Enhanced CVD Silicon Oxide Films Using $Si_2H_6$ and $N_2O$," *Abstract Intl. Conf. Metallurgical Coatings* (Apr. 24–28, 1995); J. Song et al., "Low Temperature Plasma Enhanced Chemical Vapor Deposition of Silicon Oxide Films Using Disilane and Nitrous Oxide," *J. Elec. Mat.*, vol. 24, pp. 1507–1510 (1995); J. Song et al., "*Chemical and Electrical Characteristics of Low Temperature Plasma Enhanced CVD Silicon Oxide Films Using $Si_2H_6$ and $N_2O$,*" *Thin Solid Films*, vol. 270, pp. 512–516 (1995); J. Song et al., "Structural Properties of Low Temperature Plasma Enhanced Chemical Vapor Deposited Silicon Oxide Films Using Disilane and Nitrous Oxide," *Appl. Phys. Lett.*, vol. 67, pp. 2986–2988 (1995); J. Song et al., "Effects of Native Oxide Removal from Silicon Substrate and Annealing on $SiO_2$ Films Deposited at 120° C. by Plasma Enhanced Chemical Vapor Deposition Using Disilane and Nitrous Oxide," to be published in *J. Vac. Sci. and Technol. B.* (1996); J. Song et al., "Low Temperature Plasma Enhanced Chemical Vapor Deposition of Fluorinated Silicon Oxide Films as an Interlayer Dielectric," unpublished manuscript (1996); and J. Song et al., "High Quality Fluorinated Silicon Oxide Films Prepared by Plasma Enhanced Chemical Vapor Deposition at 120° C.," unpublished manuscript (1996).

The complete disclosures of all references cited in this specification are hereby incorporated by reference. In the event of an otherwise irreconcilable conflict, however, the present specification shall control.

We claim:

1. A process for depositing a silicon oxide film onto a substrate, said process comprising the steps of:

(a) exposing the substrate to a mixture of disilane with nitrous oxide or elemental oxygen, at a temperature 120° C. or lower; and (b) creating a plasma in the mixture with a radio frequency discharge or with electron cyclotron resonance, wherein the temperature of the mixture remains 120° C. or lower, and continuing for a time sufficient to deposit the silicon oxide film from the plasma onto the substrate.

2. A process as recited in claim 1, wherein the mixture additionally contains a fluorine precursor, and wherein the deposited silicon oxide film additionally comprises fluorine.

3. A process as recited in claim 2, wherein the fluorine precursor comprises tetrafluoromethane.

4. A process as recited in claim 2, wherein the fluorine precursor comprises nitrogen trifluoride.

5. A process as recited in claim 1, wherein the mixture additionally contains a fluorine precursor, and wherein the deposited silicon oxide film additionally comprises fluorine.

6. A process as recited in claim 5, wherein the fluorine precursor comprises tetrafluoromethane.

7. A process as recited in claim 5, wherein the fluoride precursor comprises nitrogen trifluoride.

8. A process as recited in claim 1, wherein the temperature of the mixture remains below about 90° C. during said exposing and creating steps.

9. A process as recited in claim 1, wherein the temperature of the mixture remains below about 60° C. during said exposing and creating steps.

10. A process as recited in claim 1, wherein the temperature of the mixture remains below about 30° C. during said exposing and creating steps.

* * * * *